United States Patent
Tokunaga et al.

(10) Patent No.: US 9,741,913 B2
(45) Date of Patent: Aug. 22, 2017

(54) LIGHT-EMITTING DIODE AND METHOD OF MANUFACTURING SAME

(75) Inventors: Yu Tokunaga, Chichibu (JP); Atsushi Matsumura, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 14/237,261

(22) PCT Filed: Aug. 7, 2012

(86) PCT No.: PCT/JP2012/070066
§ 371 (c)(1),
(2), (4) Date: Feb. 5, 2014

(87) PCT Pub. No.: WO2013/021991
PCT Pub. Date: Feb. 14, 2013

(65) Prior Publication Data
US 2014/0183588 A1 Jul. 3, 2014

(30) Foreign Application Priority Data
Aug. 11, 2011 (JP) ................................. 2011-175888

(51) Int. Cl.
*H01L 33/60* (2010.01)
*H01L 33/00* (2010.01)
(Continued)

(52) U.S. Cl.
CPC .......... *H01L 33/60* (2013.01); *H01L 33/0079* (2013.01); *H01L 33/387* (2013.01);
(Continued)

(58) Field of Classification Search
CPC .................... H01L 33/0079; H01L 2933/0016
See application file for complete search history.

(56) References Cited

U.S. PATENT DOCUMENTS 5,753,966 A * 5/1998 Morita .................. H01S 5/0201
257/200
2001/0055764 A1* 12/2001 Empedocles .......... B82Y 15/00
435/6.11
(Continued)

FOREIGN PATENT DOCUMENTS

CN 1866560 A 11/2006
EP 2337097 A2 6/2011
(Continued)

OTHER PUBLICATIONS

International Search Report of PCT/JP2012/070066 dated Sep. 4, 2012.
(Continued)

*Primary Examiner* — Kimberly Rizkallah
*Assistant Examiner* — Mounir Amer
(74) *Attorney, Agent, or Firm* — Sughrue Mion, PLLC

(57) ABSTRACT

Provided are a light-emitting diode which prevents degradation of reflectance and which enables high-luminosity light emission, and its manufacturing method. Such a light-emitting diode includes a substrate (1) upon which are provided, in this order, a reflecting layer (6), a transparent film (8) wherein multiple ohmic contact electrodes (7) are embedded at intervals, and a compound semiconductor layer (10) including a current diffusion layer (25) and a light-emitting layer (24) in this order. The periphery of the surface of each ohmic contact electrode (7) on the substrate (1) side are covered by the transparent film (8), and the ohmic contact electrodes (7) contact the reflecting layer (6) and the current diffusion layer (25).

13 Claims, 15 Drawing Sheets

(51) Int. Cl.
  *H01L 33/14* (2010.01)
  *H01L 33/38* (2010.01)
  *H01L 33/40* (2010.01)

(52) U.S. Cl.
  CPC .............. *H01L 33/14* (2013.01); *H01L 33/38* (2013.01); *H01L 33/405* (2013.01); *H01L 2933/0016* (2013.01)

(56) References Cited

U.S. PATENT DOCUMENTS

| | | | |
|---|---|---|---|
| 2002/0036769 A1* | 3/2002 | Shimoda et al. | 356/237.1 |
| 2003/0111667 A1 | 6/2003 | Schubert | |
| 2003/0141506 A1 | 7/2003 | Sano et al. | |
| 2006/0071226 A1 | 4/2006 | Kojima et al. | |
| 2007/0102692 A1 | 5/2007 | Asahara et al. | |
| 2009/0134416 A1* | 5/2009 | Lee | 257/98 |
| 2009/0277502 A1* | 11/2009 | Yoshida et al. | 136/256 |
| 2010/0038673 A1 | 2/2010 | Wirth | |
| 2010/0065867 A1 | 3/2010 | Unno | |
| 2010/0224898 A1* | 9/2010 | Kazama | 257/98 |
| 2010/0301307 A1* | 12/2010 | Fattal | H01L 33/06 257/13 |
| 2011/0207128 A1* | 8/2011 | Cawthon | C12Q 1/6876 435/6.11 |
| 2011/0220937 A1* | 9/2011 | Jeong | H01L 33/22 257/98 |
| 2012/0119243 A1* | 5/2012 | Kim et al. | 257/98 |

FOREIGN PATENT DOCUMENTS

| | | |
|---|---|---|
| JP | 2003-224297 A | 8/2003 |
| JP | 2005-513787 A | 5/2005 |
| JP | 2006-100529 A | 4/2006 |
| JP | 2006-261609 A | 9/2006 |
| JP | 2008-153705 A | 7/2008 |
| JP | 2008-282851 A | 11/2008 |
| JP | 2009-065196 A | 3/2009 |
| JP | 2010-67891 A | 3/2010 |
| JP | 2010-519744 A | 6/2010 |
| WO | 03/052838 A2 | 6/2003 |
| WO | 2006/006556 A1 | 1/2006 |

OTHER PUBLICATIONS

Communication dated Feb. 12, 2015 from the European Patent Office in counterpart application No. 12821719.7.
Communication dated Oct. 27, 2015 from the Japanese Patent Office issued in Japanese Application No. 2011-175888.
Communication dated Feb. 17, 2017, from the State Intellectual Property Office of the P.R.C., in Chinese application No. 201280037525.1.

* cited by examiner (a)

(b)

(a)

(b)

LIGHT-EMITTING DIODE AND METHOD OF MANUFACTURING SAME

CROSS REFERENCE TO RELATED APPLICATIONS

This is a National Stage of International Application No. PCT/JP2012/070066 filed Aug. 7, 2012, claiming priority based on Japanese Patent Application No. 2011-175888 filed Aug. 11, 2011, the contents of all of which are incorporated herein by reference in their entirety.

TECHNICAL FIELD

The present invention relates to a light-emitting diode and its method of manufacture.

Priority is claimed on Japanese Patent Application No. 2011-175888, filed Aug. 11, 2011, the content of which is incorporated herein by reference.

BACKGROUND ART

Previously, as high-luminosity light-emitting diodes (abbreviation: LEDs) for emission of red or infrared light, compound semiconductor light-emitting diodes have been known which are provided, for example, with a light-emitting layer consisting of aluminum gallium arsenide (composition formula: $Al_XGa_{1-X}As$; $0 \leq X \leq 1$) or a light-emitting layer consisting of indium gallium arsenide (composition formula: $In_XGa_{1-X}As$; $0 \leq X \leq 1$). On the other hand, as high-luminosity light-emitting diodes for emission of visible light of red, orange, yellow, or yellow-green, compound semiconductor light-emitting diodes are known that are provided, for example, with a light-emitting layer consisting of aluminum gallium indium phosphide (composition formula: $(Al_XGa_{1-X})_YIn_{1-Y}P$; $0 \leq X \leq 1$, $0 < Y \leq 1$).

With respect to such compound semiconductor light-emitting diodes, for example, there is a manufacturing method, wherein a compound semiconductor layer provided with a light-emitting layer as described above is affixed to a substrate of Si or the like via a high-reflectance metal layer (reflecting layer), after which a growth substrate used for growth (e.g., GaAs substrate) is removed. In this instance, Au, Al, Ag or the like may be cited as the metal used in the reflecting layer.

However, such a reflecting layer using high-reflectance metal cannot be ohmically bonded to an aluminum gallium indium phosphide compound semiconductor layer.

Moreover, when the compound semiconductor layer and the reflecting layer come into direct contact, an alloy layer is formed by the reaction of the reflecting layer and the compound semiconductor layer, which may cause the problem that reflectance is degraded.

To solve this problem, there is a method which interposes transparent film between the compound semiconductor layer and the reflecting layer, and which disposes ohmic contact electrodes so as to penetrate this transparent film, and contact the compound semiconductor layer and the reflecting layer (see Patent Documents 1, 2).

PRIOR ART

Patent Documents

Patent Document 1: Japanese Unexamined Patent Application, First Publication No. 2008-282851

Patent Document 2: Japanese Unexamined Patent Application, First Publication No. 2010-067891

DISCLOSURE OF INVENTION

Problem to be Solved by the Invention

With respect to Patent Documents 1 and 2, the transparent film is formed on the compound semiconductor layer, after which portions of the transparent film are etched by wet etching using a mask to form holes that go through the transparent film, and ohmic contact electrodes that penetrate the transparent film are formed in these holes by vapor deposition of ohmic contact electrode material.

However, when forming the holes that go through the transparent film with this type of manufacturing method, the transparent film is first formed on the compound semiconductor layer, after which a mask is formed that has apertures corresponding to the formation positions of the ohmic contact electrodes. By conducting wet etching using this mask, the transparent film underneath the apertures is removed to form holes that go through the transparent film. However, with wet etching, side etching removes not only the transparent film underneath the aperture, but also peripheral transparent film, and the hole that is actually formed is larger than the aperture of the mask. Thus, with the aforementioned manufacturing method, it is difficult to accurately form holes that are the size of the ohmic contact electrodes. When vapor deposition of ohmic contact electrode material is conducted using this mask, a gap may be created between the transparent film and the ohmic contact electrode, because the ohmic contact electrode is formed with approximately the same size as the aperture of the mask.

The foregoing problem is described in detail below with reference to drawings.

FIG. 14 shows an enlarged cross-sectional schematic view of an ohmic contact electrode 207 of a light-emitting diode 200 and its vicinity, manufactured according to the conventional method.

In the case where the ohmic contact electrode 207 is formed according to the conventional method, there is a risk that gaps may occur between the ohmic contact electrode 207 and a transparent film 208, as shown in FIG. 14. When gaps occur in this manner, and when a reflecting layer 206 is formed on top of the ohmic contact electrode 207 and the transparent film 208, the reflecting layer 206 then enters into these gaps, and directly contacts a current diffusion layer 225. The reflecting layer 206 and the current diffusion layer 225 react at the site of direct contact, forming an alloy layer M". As light emitted by the light-emitting layer 206 is absorbed by this alloy layer M", the reflectance of the reflecting layer 206 is degraded.

FIGS. 15(a) and (b) are optical microscope images of a light-emitting diode 200 obtained by the conventional manufacturing method. In FIG. 15(a), the dotted, dense-looking portion corresponds to the ohmic contact electrodes. FIG. 15(b) is an enlarged view of the vicinity of one of these ohmic contact electrodes (diameter 9 μm). Otherwise, FIG. 15(a) is an optical microscope image observed at a stage after formation of ohmic electrodes 211, but before formation of surface electrodes (not illustrated in the drawing).

In the image of FIG. 15 (b), places where shading is densely shown are the places where radiant light is absorbed, and reflectance is degraded. The shading of the image is darkly depicted at the top of the ohmic contact electrode—i.e., at the place where the ohmic contact electrode and the current diffusion layer come into contact—because the ohmic contact electrode and the current diffusion layer react to form an alloy layer M'. Furthermore, in the portion between the ohmic contact electrode and the transparent film, it is clear that the shading of the image is darkly shown, that is, light is absorbed, and reflectance is degraded. This would seem to be due to the reflecting layer entering between the ohmic contact electrode and the transparent film, where the current diffusion layer and the reflecting layer come into contact to form the alloy layer M".

The present invention was made in light of the foregoing circumstances, and its object is to provide a light-emitting diode which prevents degradation of reflectance and which enables high-luminosity light emission by having a structure that prevents direct contact between the current diffusion layer and the reflecting layer, and that enables blockage of alloy layer formation, and a method of manufacturing the same.

Means for Solving the Problems

As a result of diligent study aimed at achieving the aforementioned objectives, the inventors perfected the present invention that is shown below.

[1] A method of manufacture of a light-emitting diode including a substrate upon which are sequentially provided a reflecting layer, a transparent film wherein multiple ohmic contract electrodes are embedded at intervals, and a compound semiconductor layer sequentially including a current diffusion layer and a light-emitting layer, which has the following steps in this order:

a step of forming a compound semiconductor layer that includes a light-emitting layer and a current diffusion layer on a growth substrate in this order;

a step of forming multiple ohmic contract electrodes that are disposed at intervals on the aforementioned current diffusion layer;

a step of forming transparent film on the aforementioned current diffusion layer so as to expose a part of the surface of each of the aforementioned multiple ohmic contact electrodes, wherein the part is a part except for periphery of the surface;

a step of forming a reflecting layer on the aforementioned transparent film, and on the exposed portions of the aforementioned ohmic contact electrodes;

a step of forming a bonding layer on the aforementioned reflecting layer;

a step of bonding a substrate to the aforementioned bonding layer;

and a step of removing the aforementioned growth substrate.

[2] The method of manufacture of a light-emitting diode according to [1] above, wherein, in the step of forming the aforementioned transparent film, the aforementioned transparent film is formed so as to cover the aforementioned multiple ohmic contact electrodes and the aforementioned current diffusion layer, and then a part of the aforementioned transparent film is removed from the surface of each of the aforementioned ohmic contract electrodes apart from the aforementioned periphery.

[3] The method of manufacture of a light-emitting diode according to [1] above, wherein, in the step which forms the aforementioned transparent film, a mask is formed on the surface of each of the aforementioned ohmic contact electrodes apart from the aforementioned periphery, and the aforementioned transparent film is formed so as to cover the aforementioned multiple ohmic contact electrodes and the aforementioned current diffusion layer, after which the aforementioned mask is removed.

[4] A light-emitting diode including a substrate upon which is sequentially provided a reflecting layer, a transparent film wherein multiple ohmic contract electrodes are embedded at intervals, and a compound semiconductor layer sequentially including a current diffusion layer and a light-emitting layer, wherein periphery of a surface of each of the aforementioned ohmic contact electrodes wherein the surface is provided on the aforementioned substrate side is covered by the aforementioned transparent film, and the aforementioned ohmic contact electrodes contact the aforementioned reflecting layer and the aforementioned current diffusion layer.

[5] The light-emitting diode according to [4] above, wherein the aforementioned periphery is in a range that is within 1.5 μm from the peripheral edges of the aforementioned ohmic contact electrode.

[6] The light-emitting diode according to [4] or [5] above, wherein the aforementioned reflecting layer is composed of any one of Au, Ag, Cu, or Al, or an alloy including one or more of these elements.

[7] The light-emitting diode according to any one of [4] to [6] above, wherein the aforementioned current diffusion layer is composed of any one of GaP, $\{Al_xGa_{(1-x)}\}_{(1-y)}In_yP$, or $\{Al_xGa_{(1-x)}\}_{(1-y)}In_yAs$.

[8] The light-emitting diode according to any one of [4] to [7] above, wherein the aforementioned transparent film is composed of any one of $SiO_2$, SiN, SiON, $Al_2O_3$, $MgF_2$, $TiO_2$, TiN, ZnO, ITO, or IZO.

[9] The light-emitting diode according to any one of [4] to [8] above, wherein a film thickness of the aforementioned transparent film is 0.05 to 1.00 μm.

Effects of the Invention

According to the foregoing configuration, as the ohmic contact electrodes are configured to be embedded in transparent electrode film, and to have their peripheral portions on the substrate side covered by the transparent electrode film, it is possible to prevent direct contact between the current diffusion layer and the reflecting layer, and prevent formation of an alloy layer. As a result, it is possible to provide a light-emitting diode that prevents degradation of reflectance, and that enables high-luminosity light emission.

BEST MODE FOR CARRYING OUT THE INVENTION

The configuration of a light-emitting diode of an embodiment applying the present invention is described below with use of drawings, along with its method of manufacture. There are cases where the drawings used in the following description are shown with enlargement of their characteristic parts for purposes of expediency in order to facilitate understanding of features, and the dimensional proportions and the like of the various components are not necessarily true to reality. Moreover, the materials, dimensions and the like enumerated in the following description are exemplary, and the present invention is not limited thereto, and may be implemented with appropriate modifications within a scope that does not alter its intent.

Figure 1:
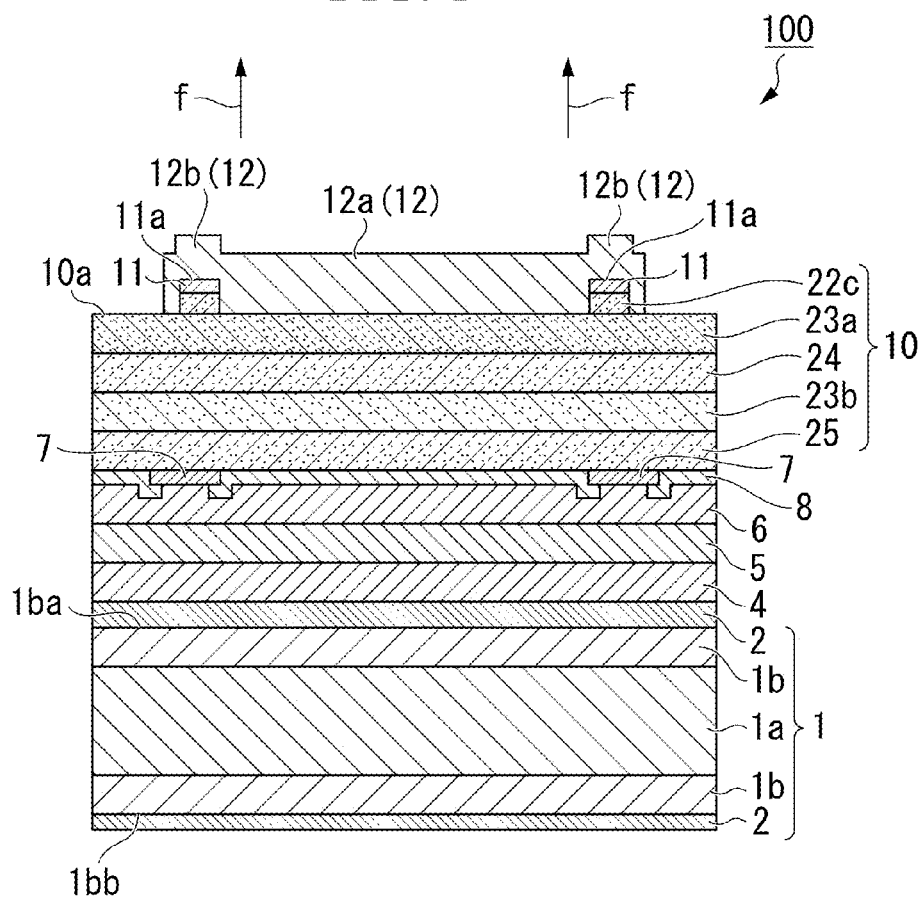
FIG. 1 is a cross-sectional schematic view of a light-emitting diode that is an embodiment of the present invention.
Figure 2:
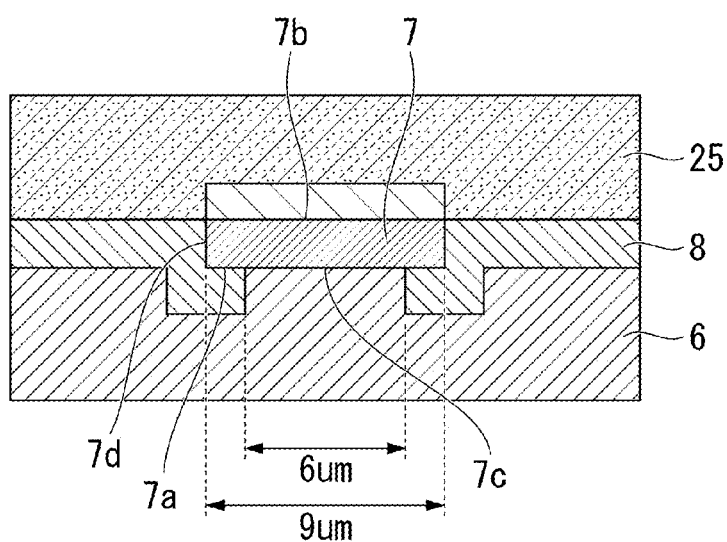
FIG. 2 is an enlarged cross-sectional schematic view of a vicinity of an ohmic contact electrode 7 shown in FIG. 1.

FIG. 1 is a cross-sectional schematic view which shows an example of a light-emitting diode of an embodiment applying the present invention. FIG. 2 is an enlarged cross-sectional schematic view of a vicinity of an ohmic contact electrode 7 in FIG. 1.

A light-emitting diode 100 of the present embodiment is a light-emitting diode with a substrate 1 upon which are sequentially provided a reflecting layer 6, a transparent film 8 wherein multiple ohmic contract electrodes 7 are embedded at intervals, and a compound semiconductor layer 10 sequentially including a current diffusion layer 25 and a light-emitting layer 24, wherein periphery of the surfaces of the ohmic contact electrodes 7, wherein the surfaces are provided on the substrate 1 side, are covered by a transparent film 8, and the ohmic contact electrodes 7 are contacted by the reflecting layer 6 and the current diffusion layer 25.

In the example shown in FIG. 1, the ohmic contact electrodes 7 consist of multiple dot-shaped conductive members, and the transparent film 8 is filled in between the conductive members. Moreover, a bonding layer 4 is provided on the substrate 1 side of the reflecting layer 6, and a barrier layer 5 is provided between the bonding layer 4 and the reflecting layer 6.

In this embodiment, ohmic electrodes 11 and surface electrodes 12 are sequentially provided on the compound semiconductor layer 10 so that they are provided on the side 10a of the layer opposite to a side where the substrate 1 is positioned.

<Ohmic Contact Electrodes>

In planar view, the ohmic contact electrode 7 consists of multiple dot-shaped conductive members, and is embedded in the below-described transparent film.

The ohmic contact electrode 7 and the below-described ohmic electrode 11 are both electrodes that have ohmic properties; the two electrodes are respectively given different names in the present embodiment in order to distinguish between them.

As shown in FIG. 2, periphery 7a of the surface of each ohmic contact electrode 7 of the present embodiment, wherein the surface is positioned on the substrate 1 side, is covered by the transparent film 8.

When described in detail using FIG. 2, with respect to the surface of the ohmic contact electrode 7, a first main surface 7b which is positioned on the compound semiconductor layer 10 side contacts the current diffusion layer 25, and side surfaces 7d contact the transparent film 8. With respect to a second main surface 7c which is positioned on the substrate 1 side, the periphery 7a including the edges is covered by the transparent film 8, and the plane of the second main surface 7c that is not covered by the transparent film 8 contacts the below-described reflecting layer 6. In short, with respect to the surface of the ohmic contact electrode 7, the first main surface 7b contacts the current diffusion layer 25, and with respect to the second main surface 7c, the periphery 7a of the second main surface 7c is covered by the transparent film 8, while the remainder of the second main surface 7c contacts the reflecting layer 6.

From the standpoint of ensuring sufficient adhesion of the ohmic contact electrode 7 to the reflecting layer 6, the periphery 7a of the ohmic contact electrode 7 of the present embodiment are preferably in a range that is within 5.0 μm and more preferably within 1.5 μm from the edges of the ohmic contact electrode 7.

Figure 3A:
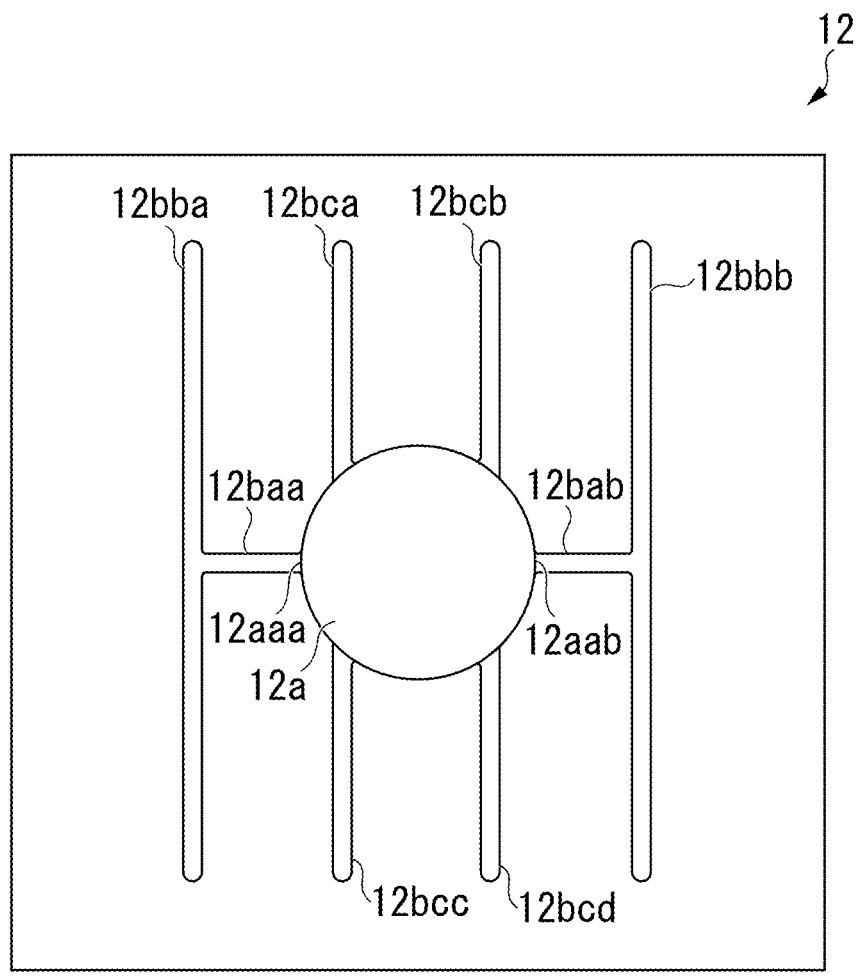
FIG. 3A is a planar schematic view of a surface electrode of a light-emitting diode that is an embodiment of the present invention.
Figure 3B:
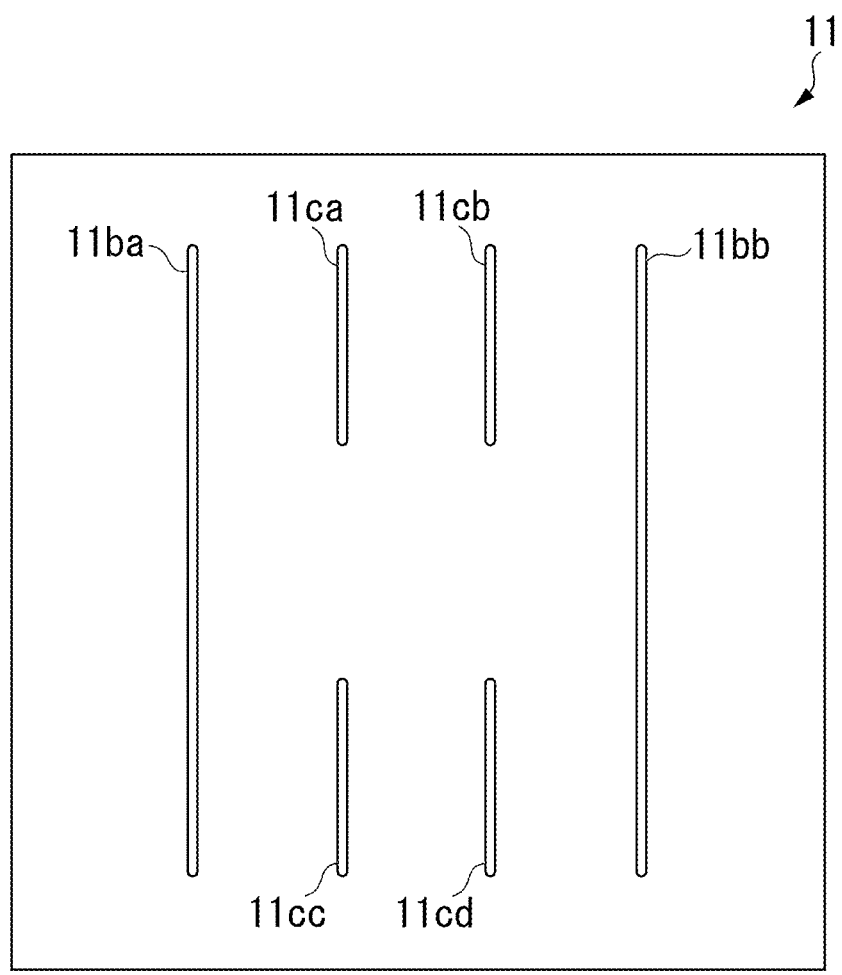
FIG. 3B is a planar schematic view of an ohmic electrode of a light-emitting diode that is an embodiment of the present invention.
Figure 3C:
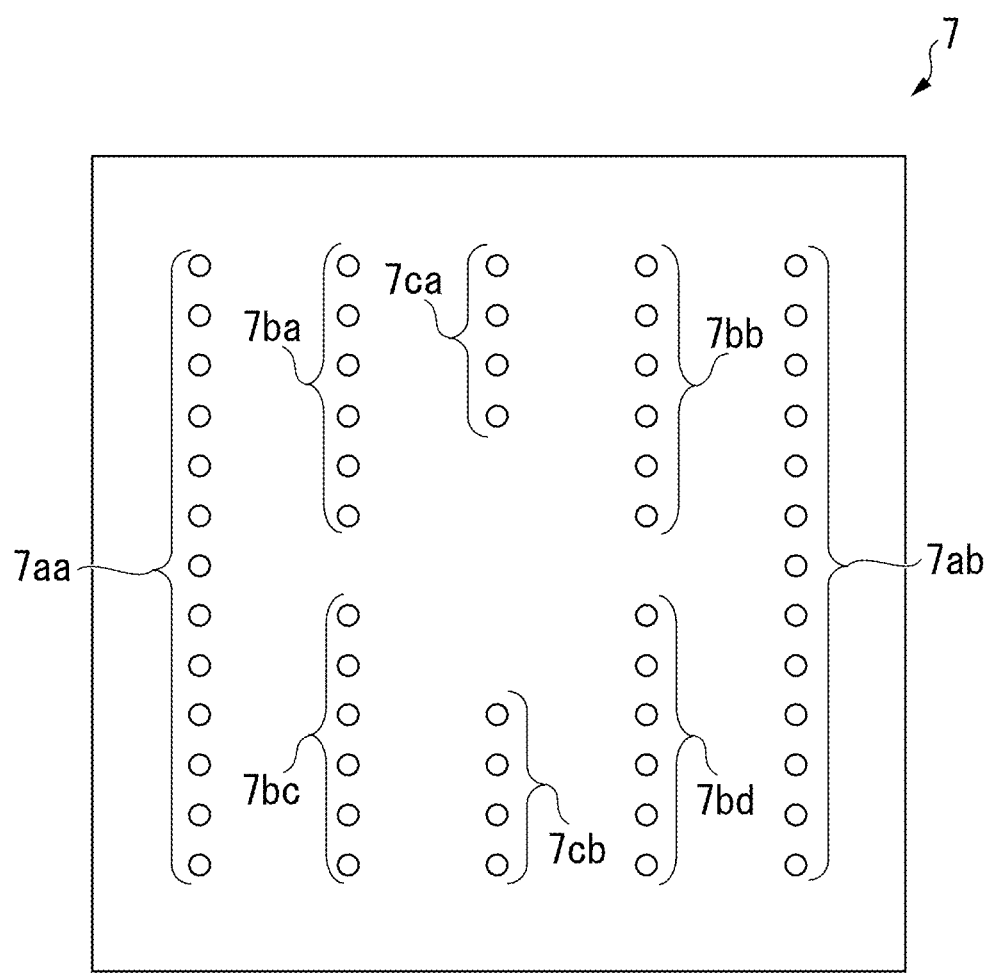
FIG. 3C is a planar schematic view of an ohmic contact electrode of a light-emitting diode that is an embodiment of the present invention.
Figure 3D:
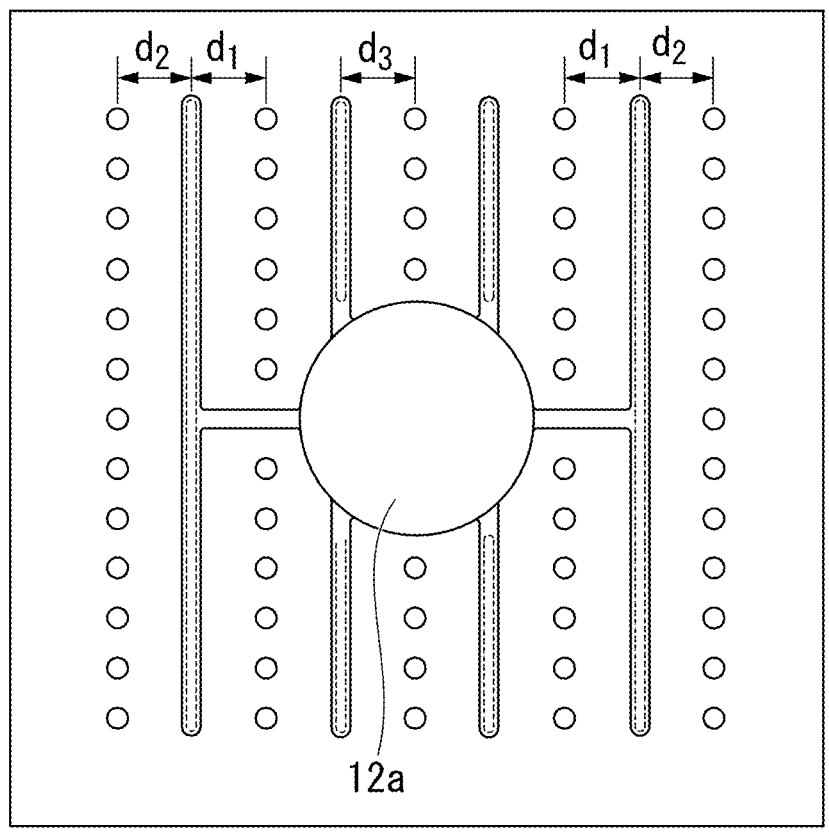
FIG. 3D is a planar schematic view of a surface electrode, an ohmic electrode, and an ohmic contact electrode of a light-emitting diode are laminated that is a first embodiment of the present invention.

As shown in FIG. 3D, the dot-shaped conductive members configuring the ohmic contact electrode 7 in the present embodiment are at positions that do not overlap with the pad 12a of the surface electrode 12 in planar view. They are disposed in rectilinear alignment at intermediate positions between the linear parts of the ohmic electrode 11, or at positions on the outer sides of the linear parts 11ba and 11bb wherein the linear parts are positioned as the two ends of the ohmic electrode 11 where a distance d2 from the linear parts 11ba and 11bb to the conductive members is on the same order as a distance d1 to intermediate positions between the linear parts. The form of the ohmic contact electrode 7 may be cylindrical, elliptic cylindrical, donut-shaped, linear, and so on.

Distances d1 and d3 from the linear parts to intermediate positions positioned between the linear parts of the ohmic electrode 11, and the distance d2 from the linear parts 11*ba* and 11*bb* that is on the outer sides of the linear parts 11*ba* and 11*bb* which are positioned as the two ends of the ohmic electrode 11 are preferably configured to be of equal distance so that current will uniformly disperse.

The dot-shaped conductive members configuring the ohmic contact electrode 7 are, for example, cylindrical members with a diameter of about 5 to 20 μm.

With respect to the linearly aligned groups of dot-shaped conductive members, the distance between adjacent conductive members is, for example, about 5 to 40 μm.

The reason why the ohmic contact electrode 7 is arranged at a position that does not overlap with the pad 12*a* of the surface electrode 12 in planar view is that when the ohmic contact electrode 7 is arranged at a position that overlaps with the pad 12*a*, the proportion of the light which is emitted directly underneath the pad and is absorbed by the pad increases, reducing light extraction efficiency, and the aforementioned arrangement serves to avoid this.

AuBe, AuZn, and the like may be used as the material of the ohmic contact electrode.

<Transparent Film>

The transparent film 8 is formed so as to fill in an area between the multiple dot-shaped conductive members configuring the ohmic contact electrode 7.

As the material of the transparent film 8, $SiO_2$, SiN, SiOn, $Al_2O_3$, $MgF_2$, $TiO_2$, TiN, ZnO, ITO, IZO, and the like may be used.

As stated above, the transparent film 8 of the present embodiment is formed so as to cover the periphery 7*a* of the ohmic contact electrode 7. After multiple ohmic contact electrodes 7 are formed in advance on the current diffusion layer 25, the transparent film 8 is formed so as to cover the periphery 7*a* of these multiple ohmic contact electrodes 7 and the current diffusion layer 25, with the result that no gaps occur between the ohmic contact electrodes 7 and the transparent film 8, enabling a structure of mutually close adhesion. Moreover, by configuring the ohmic contact electrodes 7 and the transparent film 8 so that no gaps occur between them, it is possible to prevent direct contact between the current diffusion layer 25 and the reflecting layer 6, and inhibit formation of the alloy layer which is conventionally formed.

The film thickness of the transparent film 8 of the present embodiment is preferably 0.05 to 1.00 μm. When less than 0.05 μm, there is the risk of insufficient film formation, and of concomitant occurrence of gaps between the ohmic contact electrodes 7 and the transparent film 8. On the other hand, 1.00 μm or less is preferable from the standpoint of productivity.

<Reflecting Layer>

With respect to the reflecting layer 6, the light from the light-emitting layer 24 is reflected in a frontal direction f by the reflecting layer 6, enabling improvement in light extraction efficiency in the frontal direction f, whereby the light-emitting diode can achieve higher luminosity.

As the material of the reflecting layer 6, AgPdCu alloy (APC), and metal such as gold, copper, silver, and aluminum may be used, as well as alloys and the like including one or more elements selected from among these. These materials have a high light reflectance, enabling light reflectance of 90% or more.

As shown in FIG. 2, the reflecting layer 6 of the present embodiment contacts the ohmic contact electrodes 7 and the transparent film 8 without directly contacting the current diffusion layer 25. In short, previously, the reflecting layer would enter into gaps between the transparent film and the ohmic contact electrodes, and contact the current diffusion layer, resulting in the risk of formation of an alloy layer, but with the present embodiment, the conventional alloy layer formation can be prevented, because the structure prevents direct contact of the reflecting layer 6 and the current diffusion layer 25.

<Compound Semiconductor Layer>

The compound semiconductor layer 10 is a laminate of a compound semiconductor wherein multiple layers that are epitaxially grown are laminated, and including the light-emitting layer 24.

As the compound semiconductor layer 10, for example, one may use an AlGaInP layer, AlGaInAs layer or the like that has a high light-emission efficiency and an established substrate bonding technique. An AlGaInP layer is a layer consisting of material represented by the general formula $(Al_xGa_{1-x})_YIn_{1-Y}P$ ($0 \leq X \leq 1$, $0 < Y \leq 1$). This composition is determined according to the light-emitting wavelength of the light-emitting diode. Similarly, in the case of an AlGaInAs layer which is used when fabricating a light-emitting diode for red and infrared light emission, the composition of the constituent material is determined according to the light-emitting wavelength of the light-emitting diode.

The compound semiconductor layer 10 is either an n-type or p-type conductive compound semiconductor, and a pn junction is internally formed. "AlGaInAs" also includes AlGaAs, GaAs, GaInAs, and the like.

Here, the polarity of the surface of the compound semiconductor layer 10 may be either p-type or n-type.

As shown in FIG. 1, the compound semiconductor layer 10 is, for example, composed of a contact layer 22*c*, a clad layer 23*a*, a light-emitting layer 24, a clad layer 23*b*, and a current diffusion layer 25. The clad layer 23*a* may also adopt a two-layer structure with a surface roughened layer that has a roughened surface in order to improve light extraction, and a clad layer.

The contact layer 22*c* is a layer that serves to lower the contact resistance of the ohmic electrode. For example, it is composed of Si-doped n-type GaAs, with a carrier concentration of $1 \times 10^{18}$ $cm^{-3}$, and a layer thickness of 0.05 μm.

The light-emitting layer 24 is constituted by a laminar structure of 20 pairs of undoped $(Al_{0.1}Ga_{0.9})_{0.5}In_{0.5}P$/$(Al_{0.5}Ga_{0.5})_{0.5}In_{0.5}P$, and has a layer thickness of 0.2 μm.

The light-emitting layer 24 has a structure such as double-hetero (DH), single quantum well (SQW), multi quantum well (MQW), or the like. In this instance, double hetero is a structure enclosing a carrier that supports radiative recombination. Quantum well is a structure which has a well layer and two barrier layers sandwiching the well layer, where SQW has one well layer, and MQW has two or more well layers. As the method of forming the compound semiconductor layer 10, MOCVD or the like may be used.

In order to obtain light with excellent monochromatic properties from the light-emitting layer 24, it is preferable to use an MQW structure for the light-emitting layer 24.

The clad layer 23*b* is, for example, composed of Mg-doped p-type $Al_{0.5}In_{0.5}P$, with a carrier concentration of $8 \times 10^{17}$ $cm^{-3}$, and a layer thickness of 0.05 μm.

The current diffusion layer 25 is, for example, an Mg-doped p-type GaP layer, with a carrier concentration of $5 \times 10^{18}$ $cm^{-3}$, and a layer thickness of 2 μm. Here, as the current diffusion layer 25, one may also use either $\{Al_xGa_{(1-x)}\}_{(1-y)}In_yP$ or $\{Al_xGa_{(1-x)}\}_{(1-y)}In_yAs$.

The configuration of the compound semiconductor layer 10 is not limited to the structure described above, and may also have a current blocking layer or a current constricting layer or the like in order to restrict the conduction region of the element drive current.

(Electrode Structure)

FIG. 3A is a planar schematic view which shows an example of a surface electrode of the present embodiment. FIG. 3B is a planar schematic view which shows an example of an ohmic electrode of the present embodiment. FIG. 3C is a planar schematic view which shows an example of an ohmic contact electrode of the present embodiment. FIG. 3D is a planar schematic view which depicts overlapping of the surface electrode, ohmic electrode, and ohmic contact electrode.

<Surface Electrode>

The surface electrode 12 consists of a pad 12a, and linear parts 12b connecting to the pad 12.

In the present embodiment, the pad 12a is circular in planar view, but other shapes apart from circular are also acceptable.

The linear parts 12b consist of, for example, 2 first rectilinear parts 12baa and 12bab that extend in mutually opposite directions from the peripheral ends (peripheral end parts) 12aaa and 12aab that sandwich the diameter of the circular pad 12 on a straight line that transits the center of the circular pad 12, and 6 second rectilinear parts 12bba, 12bbb, 12bca, 12bcb, 12bcc, and 12bcd that extend orthogonally relative to the first rectilinear parts 12baa and 12bab.

The linear parts 12b of the present embodiment are configured to consist of a pad, and linear parts that connect to the pertinent pad, but one is not limited to this configuration. For example, it is also acceptable to have a configuration consisting of a pad, and multiple linear parts extending radially in various directions from the pertinent pad.

Moreover, the linear parts 12b of the present embodiment are configured to consist of 2 first rectilinear parts and 6 second rectilinear parts, but one is not limited to these numbers.

With respect to the size of the pad 12a, if the shape is circular, the diameter is, for example, about 50 to 150 µm.

The width of the linear parts 12b is set wider than the width of the linear parts of the ohmic electrode 11 so as to cover them, and is, for example, about 2 to 20 µm. Although there is no need to set the same width for all of the first rectilinear parts and second rectilinear parts, it is preferable from the standpoint of uniform light extraction to set an identical width for rectilinear parts arranged at symmetrical positions.

As the material of the surface electrode, one may use Au/Ti/Au, (Au/Pt/Au, Au/Cr/Au, AuTa/Au, Au/W/Au, Au/Mo/Au), and the like.

<Ohmic Electrode>

As shown in FIG. 3B, the ohmic electrode 11 of the present embodiment consists of 6 linear parts 11ba, 11bb, 11ca, 11cb, 11cc, and 11cd.

The ohmic electrode 11 of the present embodiment is configured from 6 linear parts, but one is not limited to this number. The ohmic electrode 11 may be formed in a discontinuous arrangement underneath the linear parts 12b of the surface electrode, e.g., in the arrangement of a dot-shaped electrode.

The respective linear parts of the ohmic electrode 11 are disposed at positions that do not overlap with the pad 12a of the surface electrode 12 in planar view, and are disposed at positions that are respectively covered by the 6 second rectilinear parts 12bba, 12bbb, 12bca, 12bcb, 12bcc, and 12bcd of the linear parts 12b of the surface electrode 12.

That is, the 2 long linear parts 11ba and 11bb are respectively disposed underneath the second rectilinear parts 12bba and 12bbb, while the 4 short linear parts 11ca, 11cb, 11cc, and 11cd are respectively disposed underneath the second rectilinear parts 12bca, 12bcb, 12bcc, and 12bcd.

The reason why the ohmic electrode 11 is arranged in this manner at positions that do not overlap with the pad 12a of the surface electrode 12 in planar view is that when the ohmic electrode 11 is arranged at positions that overlap with the pad 12a, the proportion of the light, which is emitted from underneath the pad and is absorbed by the pad increases, reducing light extraction efficiency, and the aforementioned arrangement serves to avoid this.

The width of the linear parts configuring the ohmic electrode 11 is set narrower than the width of the linear parts of the surface electrode 12 so as to be covered by them, and is, for example, about 1 to 10 µm. Although there is no need to set the same width for all of the linear parts, it is preferable from the standpoint of uniform light extraction to set an identical width for linear parts disposed at symmetrical positions.

As the material of the ohmic electrode, one may use AuGeNi, AuGe, AuNiSi, AuSi, and the like.

<Barrier Layer>

The barrier layer 5 is able to inhibit metal contained in the below-mentioned substrate 1 from diffusing, and reacting with the reflecting layer 6.

As the material of the barrier layer 5, one may use nickel, titanium, platinum, chrome, tantalum, tungsten, molybdenum, and so on.

The barrier layer is able to enhance barrier performance by combining two or more types of metal, e.g., by combining platinum and tungsten.

Even if a barrier layer is not provided, the bonding layer can be given the same function as a barrier layer by adding these materials to the bonding layer.

<Bonding Layer>

The bonding layer 4 is a layer that serves to join the compound semiconductor layer 10 (including the light-emitting layer 24) and the like to the substrate 1.

As the material of the bonding layer 4, one may use an Au eutectic metal or the like that is chemically stable, and that has a low melting point. As an Au eutectic metal, one may cite eutectic compositions of alloys such as AuGe, AuSn, AuSi, AuIn, and the like.

<Substrate>

As shown in FIG. 1, the substrate 1 is joined to the surface of the bonding layer 4 that is on the opposite side of the compound semiconductor layer 10. Metal material, silicon, germanium, and the like may be used as the substrate 1, and a metal substrate using metal material is preferable from the standpoints of cost, mechanical strength, and heat release. The substrate 1 shown in FIG. 1 illustrates the case where a metal substrate is adopted.

An example where the substrate 1 of the present embodiment is a metal substrate is described below with reference to drawings.

Figure 4:
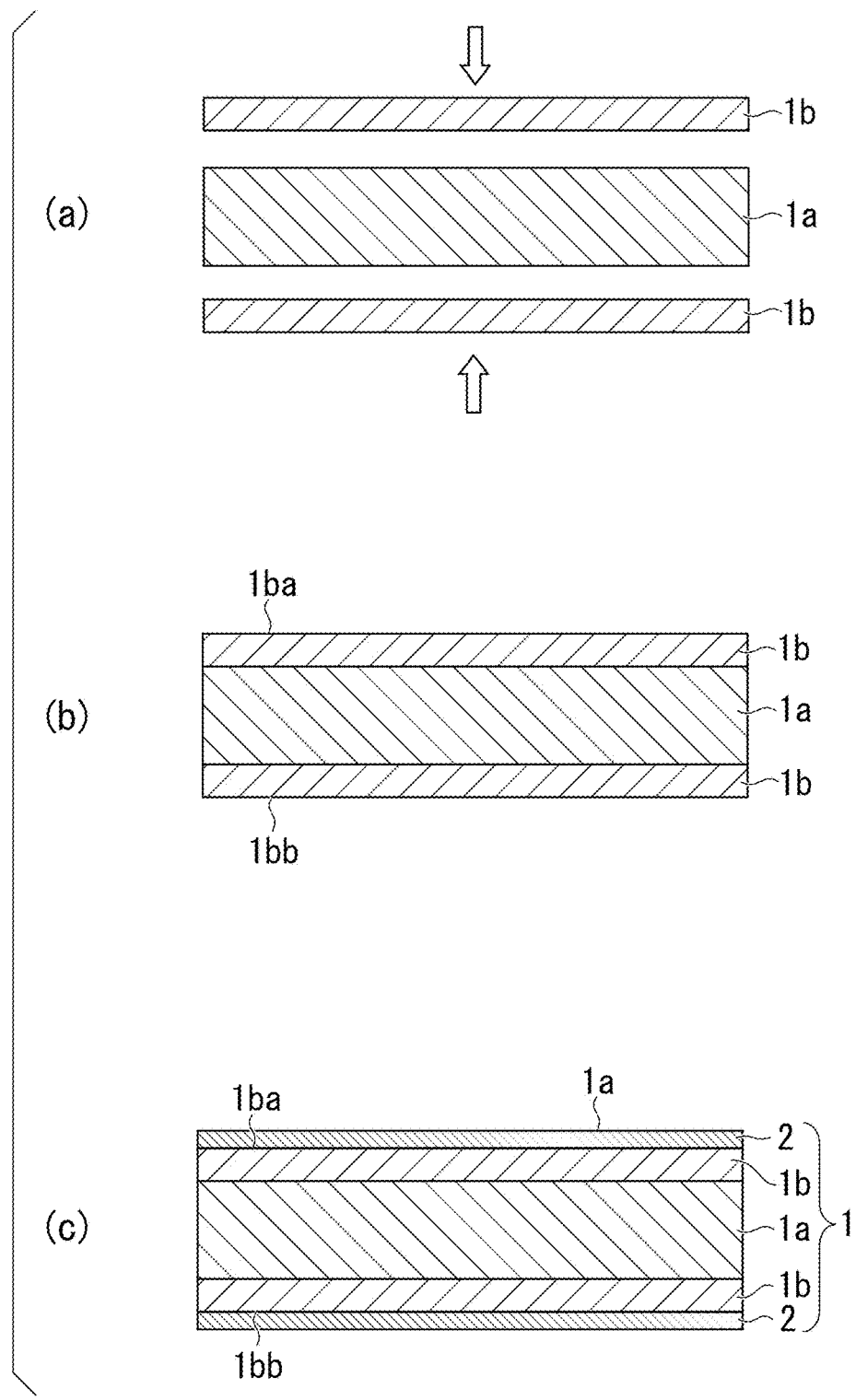
FIG. 4 is a cross-sectional schematic view of a portion of a metal substrate that serves to describe manufacturing steps of a substrate of the present invention, and shows (a) a first step, (b) a second step, and (c) a third step.

FIG. 4 (a) to FIG. 4 (c) are cross-sectional schematic views of portions of a metal substrate that serve to describe a metal substrate manufacturing process.

The substrate 1 (metal substrate) of the present embodiment is composed of three metal layers 1a, 1b, 1a, as well as metal protection film 2 that covers an upper surface 1ba and a lower surface 1bb, and that is resistant to etchant. It is also preferable to cover the side surfaces of the metal substrate 1 with the metal protection film 2.

The bonding of the metal substrate 1 and the compound semiconductor layer 10 is conducted by bonding the bonding layer 4 to the bonding surface (upper surface) 1ba of the metal substrate 1 via the metal protection film 2.

The material of the metal protection film 2 is preferably composed of metal including at least one of chrome or nickel that have excellent adhesion, and chemically stable platinum or gold.

It is most suitable that the metal protection film 2 is a layer composed of nickel that has satisfactory adhesion and gold that has excellent chemical resistance.

There are no particular limitations on the thickness of the metal protection film 2, but from the standpoint of balancing cost with etchant resistance, an appropriate range would be 0.2 to 5 μm, and preferably 0.5 to 3 μm. In the case of expensive gold, a thickness of 2 μm or less is desirable.

The thickness of the metal substrate 1 is preferably 50 μm or more and 150 μm or less.

In the case where the thickness of the metal substrate 1 is greater than 150 μm, there is an undesirable increase in the manufacturing cost of the light-emitting diode. In the case where the thickness of the metal substrate 1 is less than 50 μm, cracking, chipping, and warping tend to occur during handling, engendering a risk of reduction in manufacturing yield.

With respect to the configuration of the multiple metal layers, it is preferable to alternately laminate two types of metal layer, i.e., a first metal layer and a second metal layer.

As to the number of first metal layers and second metal layers per metal substrate 1, a total of 3 to 9 layers is preferable, and 3 to 5 layers is more preferable.

In the case where the total number of first metal layers and second metal layers is two, thermal expansion in the thickness direction is irregular, causing warpage of the metal substrate 1. Conversely, in the case where the total number of first metal layers and second metal layers exceeds nine, the layer thickness of each first metal layer and second metal layer must be made thinner. It would be difficult to fabricate a single layer substrate composed of the first metal layer or the second metal layer with a thin layer thickness; this could cause a lack of uniformity in the layer thickness of the respective layers, and lead to irregularities in the properties of the light-emitting diode. Furthermore, as manufacture of a single layer substrate is difficult, it would risk increasing the manufacturing cost of the light-emitting diode.

The total number of layers of the first metal layer and the second metal layer is preferably an odd number (in this case, the outermost layer is the first metal layer).

With respect to three layer structure, it is particularly preferable that two metal layers sandwiching a metal layer are composed of the same metal material. In this case, the two sandwiching metal layers can be subjected to wet etching using the same etchant to remove portions corresponding to the planned cutting lines.

As stated above, the metal protection film 2 is provided on the surface of the metal substrate 1, and when this metal protection film 2 is formed in the order of Ni film and Au film from the metal substrate 1 side, such a structure is preferable for the bonding layer which is formed with Au—Si. On the surface of the metal substrate 1, eutectic metal may be formed for die bonding. Bonding of the die bond can then be conducted by eutectic bonding that has stable electrical contact.

With respect to methods for bonding the metal substrate 1 to the compound semiconductor layer 10, apart from the aforementioned eutectic bonding, one may also apply known techniques such as diffusion bonding, adhesives, normal temperature bonding, and so on.

<First Metal Layer>

In the case where the second metal layer uses material that has a smaller thermal expansion coefficient than the compound semiconductor layer, the first metal layer is preferably composed of material that has a larger thermal expansion coefficient than at least the compound semiconductor layer. By adopting this configuration, the thermal expansion coefficient of the entire metal substrate will approximate the thermal expansion coefficient of the compound semiconductor layer, enabling inhibition of warping and cracking of the metal substrate when the compound semiconductor layer and the metal substrate are bonded together, and enabling improvement of the manufacturing yield of the light-emitting diode. Accordingly, in the case where the second metal layer uses material that has a larger thermal expansion coefficient than the compound semiconductor layer, the first metal layer is preferably composed of material that has a smaller thermal expansion coefficient than the compound semiconductor layer.

As the first metal layer, it is preferable to use, for example, silver (thermal expansion coefficient=18.9 ppm/K), copper (thermal expansion coefficient=16.5 ppm/K), gold (thermal expansion coefficient=14.2 ppm/K), aluminum (thermal expansion coefficient=23.1 ppm/K), nickel (thermal expansion coefficient=13.4 ppm/K), or alloys of these and the like.

The layer thickness of the first metal layer is preferably 5 μm or more and 50 μm or less, and more preferably 5 μm or more and 20 μm or less.

The layer thicknesses of the first metal layer and the second metal layer may differ. Furthermore, in the case where the metal substrate 1 is formed by multiple first metal layers and second metal layers, the layer thicknesses of the respective layers may differ.

Relative to the thickness of the metal substrate 1, the total thickness of the first metal layer is preferably 5% or more and 50% or less, 10% or more and 30% or less is more preferable, and 15% or more and 25% or less is still more preferable. In the case where total thickness of the first metal layer is less than 5% of the thickness of the metal substrate 1, the effects of the first metal layer that has the high thermal expansion coefficient are reduced, and the heat sink function is diminished. Conversely, in the case where the thickness of the first metal layer exceeds 50% of the thickness of the metal substrate 1, cracking of the metal substrate 1 due to heat cannot be inhibited when the metal substrate 1 is connected to the compound semiconductor layer 10. In short, due to the large difference in thermal expansion coefficients between the first metal layer and the compound semiconductor layer 10, heat-induced cracking of the metal substrate 1 and bonding defects may occur.

Particularly in the case where copper is used as the first metal layer, the total thickness of the copper relative to the thickness of the metal substrate 1 is preferably 5% or more and 40% or less, more preferably 10% or more and 30% or less, and still more preferably 15% or more and 25% or less.

The layer thickness of the first metal layer is preferably 5 μm or more and 30 μm or less, and more preferably 5 μm or more and 20 μm or less.

<Second Metal Layer>

In the case where the first metal layer uses material that has a larger thermal expansion coefficient than the compound semiconductor layer, the second metal layer is preferably composed of material that has a smaller thermal expansion coefficient than the compound semiconductor layer. By adopting this configuration, the thermal expansion coefficient of the entire metal substrate will approximate the thermal expansion coefficient of the compound semiconductor layer, enabling inhibition of warping and cracking of the metal substrate when the compound semiconductor layer and the metal substrate are bonded together, and enabling improvement of the manufacturing yield of the light-emitting diode. Accordingly, in the case where the first metal layer uses material that has a smaller thermal expansion coefficient than the compound semiconductor layer, the second metal layer is preferably composed of material that has a larger thermal expansion coefficient than the compound semiconductor layer.

For example, in the case where an AlGaInP layer (thermal expansion coefficient=approximately 5.3 ppm/K) is used as the compound semiconductor layer, the second metal layer preferably uses molybdenum (thermal expansion coefficient=5.1 ppm/K), tungsten (thermal expansion coefficient=4.3 ppm/K), chromium (thermal expansion coefficient=4.9 ppm/K), or alloys of these and the like.

[Method of Manufacture of Light-Emitting Diode]

Next, a method of manufacture of a light-emitting diode that is one embodiment of the present invention is described.

The manufacturing method of the light-emitting diode of the present embodiment is characterized by having, in the following order: a step which forms a compound semiconductor layer that sequentially includes a light-emitting layer and a current diffusion layer on a growth substrate; a step which forms multiple ohmic contact electrodes that are disposed at intervals on a current diffusion layer; a step which forms transparent film on the current diffusion layer so that the surfaces of the multiple ohmic contact electrodes apart from periphery are exposed; a step which forms reflecting film on the transparent film and on the exposed portions of the ohmic contact electrodes; a step which forms a bonding layer on the reflecting layer; a step which bonds a substrate onto the bonding layer; and a step which removes a growth substrate.

<Substrate Manufacturing Process>

As the substrate of the present embodiment, a metal substrate, silicon substrate, or germanium substrate may be adopted. The case is described below where a metal substrate is used as the substrate 1.

FIG. 4 (a) to FIG. 4 (c) are cross-sectional schematic views of a portion of a metal substrate that serve to describe a metal substrate manufacturing process.

In the present embodiment, a first metal layer 1b with a thermal expansion coefficient that is higher than the material of the compound semiconductor layer 10 and a second metal layer 1b with a thermal expansion coefficient that is smaller than the material of the compound semiconductor layer 10 are adopted, and hot pressing is conducted to form the substrate 1 (metal substrate).

Specifically, first of all, two approximately tabular first metal layers 1b and one approximately tabular second metal layer 1a are prepared. For example, Cu of 10 μm thickness is used as the first metal layer 1b, and Mo of 75 μm thickness is used as the second metal layer 1a.

Next, as shown in FIG. 4(a), the second metal layer 1a is inserted between the two first metal layers 1b, and these are arranged with superimposition.

Next, the superimposed metal layers are disposed in a prescribed pressurization device, and loads are imposed at high temperature on the first metal layers 1b and the second metal layer 1a in the directions of the arrow marks. As a result, when the first metal layers 21 are Cu, and the second metal layer 22 is Mo, a metal substrate 1 is formed that is composed of the three layers of Cu (10 μm)/Mo (75 μm)/Cu (10 μm), as shown in FIG. 4(b).

The metal substrate 1 has, for example, a thermal expansion coefficient of 5.7 ppm/K, and a thermal conductivity of 220 W/m·K.

Next, as shown in FIG. 4(c), the metal protection film 2 is formed covering the entire surface of the metal substrate 1, that is, the top surface, the bottom surface, and the side surfaces. At this time, as the metal substrate has yet to be cut for purposes of division into individual light-emitting diodes, the side surfaces covered by the metal protection film are the peripheral side surfaces of the metal substrate (plate). Accordingly, in the case where the side surfaces of the metal substrate 1 of each light-emitting diode after division are to be covered with the metal protection film 2, a separate step for covering the side surfaces with metal protection film is conducted.

As FIG. 4(c) shows part of an area of the metal substrate (plate) where there is no peripheral end side, the metal protection film of a peripheral side surface is not depicted in the drawing.

The metal protection film may be formed by known film formation methods, but a plating method capable of film formation over the entire surface including the side surfaces is optimal.

For example, with non-electrolytic plating, nickel and then gold are plated to fabricate a metal substrate 6 where the top surface, side surfaces, and bottom surface of the metal substrate are covered with nickel film and gold film (metal protection film).

There are no particular limitations on the plating material, and conventional materials such as copper, silver, nickel, chromium, platinum, and gold may be applied. An optimal layer is a layer in which nickel which has good adhesion, and gold which has excellent chemical resistance are combined.

The plating method may employ conventional techniques and chemicals. A non-electrolytic plating method which does not require electrodes is preferable for reasons of simplicity.

<Compound Semiconductor Layer Formation Step>

Figure 5:
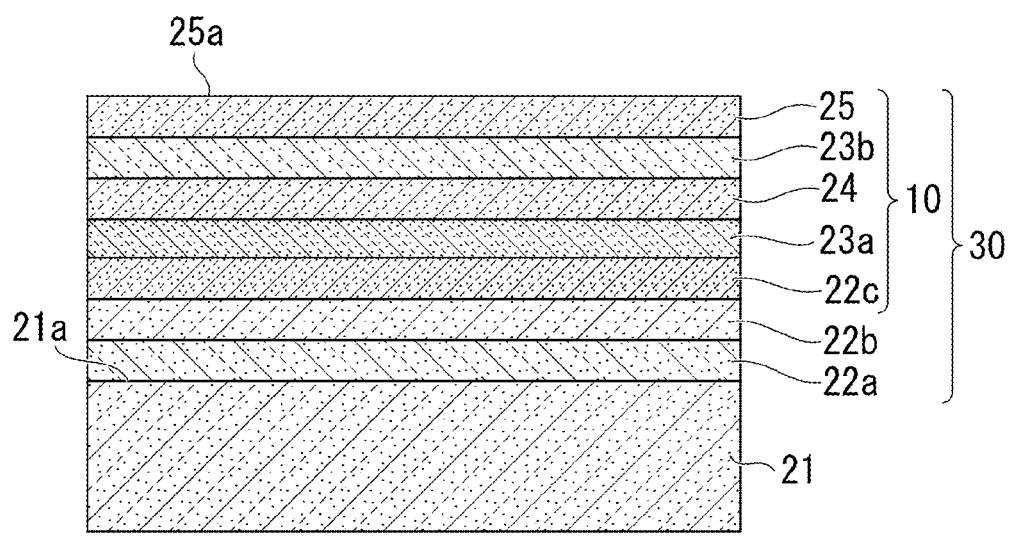
FIG. 5 is a cross-sectional schematic view that serves to describe a method of manufacture of a light-emitting diode that is an embodiment of the present invention.

First, as shown in FIG. 5, multiple epitaxial layers are grown on a single surface 21a of a semiconductor substrate (growth substrate) 21 to form an epitaxial laminate 30 including the compound semiconductor layer 10.

The semiconductor substrate 21 is a substrate used for forming the epitaxial laminate 30. For example, it is an Si-doped n-type GaAs single crystal substrate wherein the single face 21a is a surface inclined at 15° from the (100) surface. In the case where AlGaInP layers or AlGaAs layers are used as the epitaxial laminate 30, a gallium arsenide (GaAs) single crystal substrate may be used as the substrate on which the epitaxial laminate 30 is formed.

As the method of formation of the compound semiconductor layer 10, metal organic chemical vapor deposition (MOCVD), molecular beam epitaxy (MBE), liquid phase epitaxy (LPE), or the like may be used.

In the present embodiment, the respective layers are epitaxially grown using reduced-pressure MOCVD employing trimethyl aluminum $((CH_3)_3Al)$, trimethyl gallium $((CH_3)_3Ga)$, and trimethyl indium $((CH_3)_3In)$ as the raw material of group-III constituent elements.

As the Mg doping raw material, bis-cyclopentadienyl magnesium $((C_5H_5)_2Mg)$ is used. As the Si doping raw material, disilane $(Si_2H_6)$ is used. As the raw material of group-V constituent elements, phosphine $(PH_3)$ or arsine $(AsH_3)$ is used.

The p-type current diffusion layer (GaP layer) 25 is, for example, grown at 750° C., and the other epitaxial growth layers are, for example, grown at 730° C.

Specifically, first of all, a buffer layer 22a composed of n-type GaAs doped with Si is formed on a surface 21a of the semiconductor substrate 21. With respect to the buffer layer 22a, for example, n-type GaAs doped with Si is used, the carrier concentration is $2\times10^{18}$ cm$^{-3}$, and film thickness is 0.2 µm.

Next, in the present embodiment, an etching stop layer 22b composed of Si-doped n-type $(Al_{0.5}Ga_{0.5})_{0.5}In_{0.5}P$ is formed on the buffer layer 22a.

The etching stopper layer 22b is a layer that serves to prevent etching of the clad layer and the light-emitting layer when the semiconductor substrate is subjected to etching removal, and is, for example, composed of Si-doped $(Al_{0.5}Ga_{0.5})_{0.5}In_{0.5}P$ with a layer thickness of 0.5 µm.

Next, a contact layer 22c composed of Si-doped n-type GaAs is formed on the etching stop layer 22b.

Next, a clad layer 23a composed of Si-doped n-type $Al_{0.5}In_{0.5}P$ is formed on the contact layer 22c.

Otherwise, the clad layer 23a may adopt a two-layer structure with a surface roughened layer whose surface has been roughened in order to improve light extraction, and a clad layer. In this case, the surface roughened layer should be formed before forming the clad layer 23a, and Si-doped n-type $(Al_{0.5}Ga_{0.5})_{0.5}In_{0.5}P$ may be used as the surface roughened layer.

Next, a light-emitting layer 24 composed of a laminar structure of 20 pairs of undoped $(Al_{0.1}Ga_{0.9})_{0.5}In_{0.5}P$/$(Al_{0.7}Ga_{0.3})_{0.5}In_{0.5}P$ is formed on the clad layer 23a.

Next, a clad layer 23b composed of p-type $Al_{0.5}In_{0.5}P$ doped with Mg is formed on the light-emitting layer 24.

Next, a p-type GaP layer (current diffusion layer) 25 doped with Mg is formed on the clad layer 23b.

Next, the surface 25a of the p-type GaP layer 25 on the opposite side of the semiconductor substrate 21 is subjected to specular polishing to a depth of 1 µm from the surface, and surface roughness is, for example, brought within 0.18 nm.

Otherwise, it is also acceptable to provide a guide layer between the clad layers 23a, 23b and the light-emitting layer 24.

<Ohmic Contact Electrode Formation Step>

Figure 6:
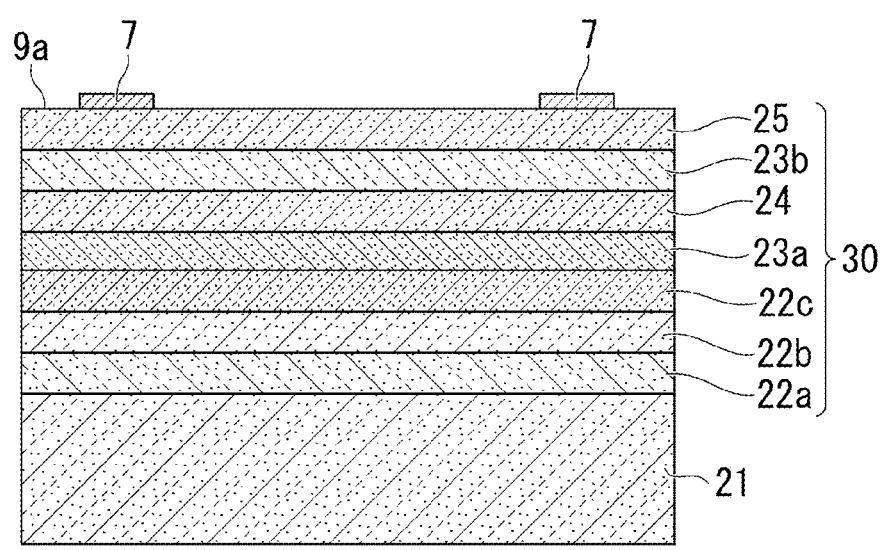
FIG. 6 is a cross-sectional schematic view that serves to describe a method of manufacture of a light-emitting diode that is an embodiment of the present invention.

Next, as shown in FIG. 6, multiple ohmic contact electrodes 7 are formed on the current diffusion layer 25.

First, masks having apertures corresponding to the formation positions of the ohmic contact electrodes 7 are formed on the current diffusion layer 25, and conductive members configuring the ohmic contact electrodes 7 and consisting of, for example, AuBe alloy are multiply formed on the current diffusion layer 25 using vapor deposition. At this time, in a group of multiple ohmic contact electrodes 7 that are linearly arranged, the distance between adjacent ohmic contact electrodes 7 is, for example, set to 5 to 40 µm.

The multiple ohmic contact electrodes 7 are formed so as to be linearly arranged at positions that do not overlap in planar view with the pad 12a of the surface electrode 12 that is formed in a subsequent step.

As to the form of the ohmic contact electrodes 7, for example, cylindrical members with a diameter of 5 to 20 µm may be used, but one is not limited thereto.

The thickness of the ohmic contact electrodes 7 is preferably set to 0.05 to 1.00 µm.

<Transparent Film Formation Step>

Figure 7:
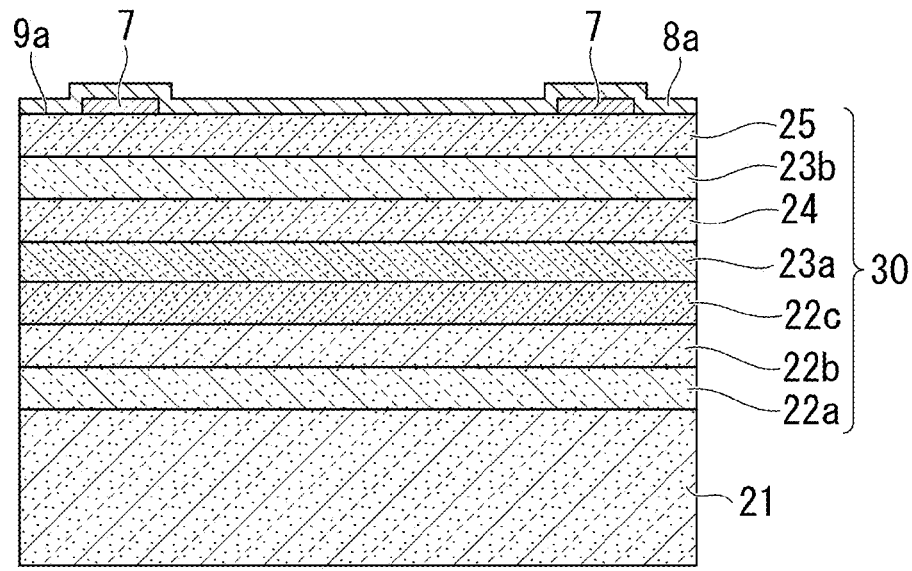
FIG. 7 is a cross-sectional schematic view that serves to describe a method of manufacture of a light-emitting diode that is an embodiment of the present invention.

Next, as shown in FIG. 7, an SiO$_2$ film 8a that constitutes the transparent film 8 is formed over the entire surface of the current diffusion layer 25 so as to cover the multiple ohmic contact electrodes 7. As a method for forming the SiO$_2$ film 8a, there is, for example, CVD. As material configuring the transparent film 8, one may use SiO$_2$, SiN, SiON, Al$_2$O$_3$, MgF$_2$, TiO$_2$, TiN, ZnO, ITO, IZO, and the like.

The film thickness of the SiO$_2$ film 8a of this instance is preferably set to 0.05 to 1.00 µm.

Figure 8:
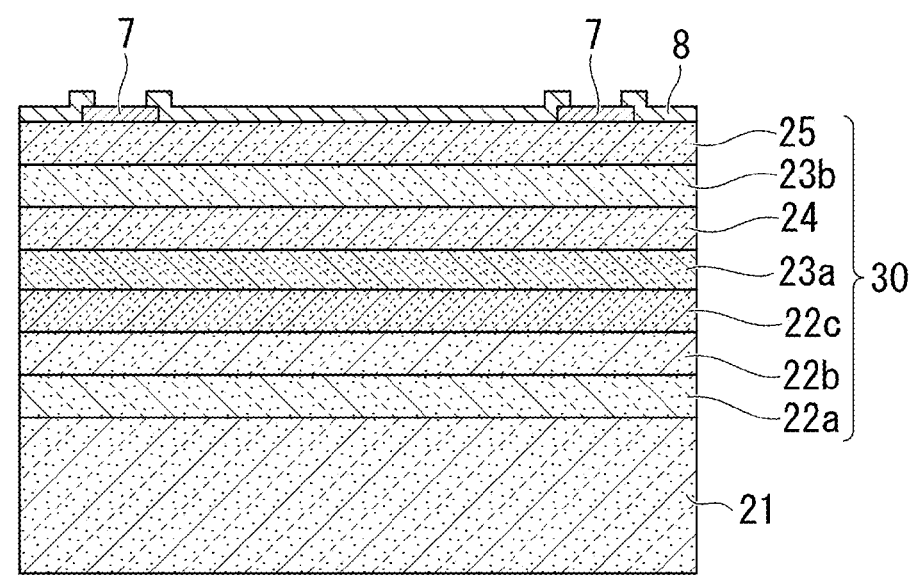
FIG. 8 is a cross-sectional schematic view that serves to describe a method of manufacture of a light-emitting diode that is an embodiment of the present invention.

Next, as shown in FIG. 8, using photolithography and etching techniques, the SiO$_2$ film 8a is removed so as to expose the surfaces of the multiple ohmic contact electrodes 7 except for the periphery 7a thereof. By this means, the transparent film 8 is formed over the entire surface of the current diffusion layer 25, and on the periphery 7a of the ohmic contact electrodes 7.

When described in detail, first, the SiO$_2$ film 8a is formed so as to cover the multiple ohmic contact electrodes 7, after which a photoresist pattern is formed on the SiO$_2$ film 8a so as to expose the surfaces of the ohmic contact electrodes 7 except for the periphery 7a, and the SiO$_2$ film 8a on the ohmic contact electrodes 7 is removed apart from the periphery 7a using a fluoric etchant. By this means, the transparent film 8 can be formed so as to cover the current diffusion layer 25 and the periphery 7a of the ohmic contact electrodes 7.

The method for forming the transparent film 8 so as to cover the current diffusion layer 25 and the periphery 7a of the ohmic contact electrodes 7 is not limited to the foregoing method. For example, it is also acceptable to form the ohmic contact electrodes 7, subsequently form masks on the surfaces of the ohmic contact electrodes 7 apart from the periphery 7a, and then form the transparent film 8 so as to cover the multiple ohmic contact electrodes 7 and the current diffusion layer 25.

After the ohmic contact electrodes 7 have been formed in advance in this manner, the transparent film 8 is formed so as to cover the periphery 7a of the ohmic contact electrodes 7 and the current diffusion layer 25, thereby enabling prevention of the gaps between the transparent film and the ohmic contact electrodes that have previously proven problematic.

<Reflecting Layer Formation Step>

Figure 9:
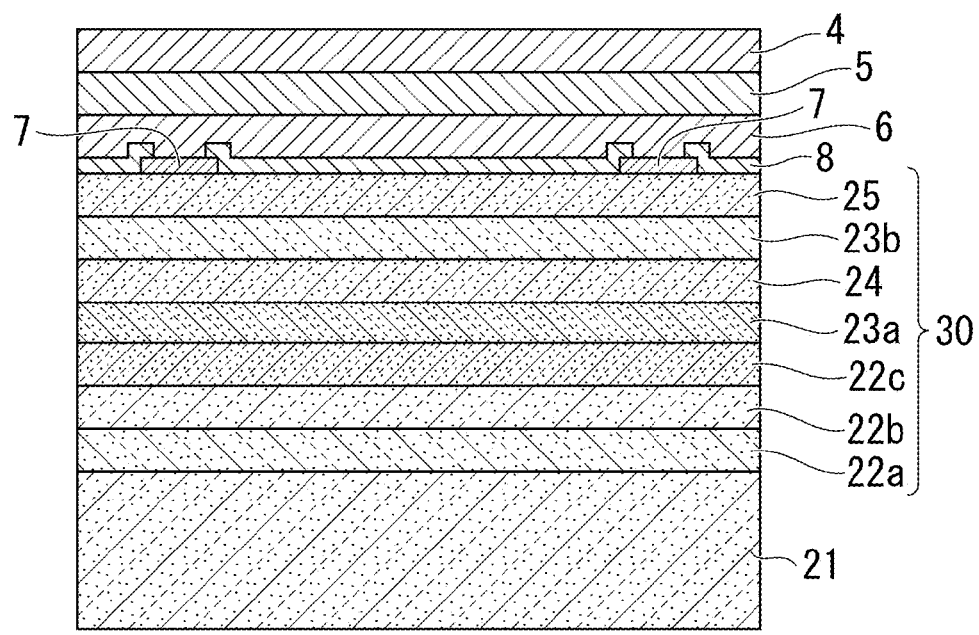
FIG. 9 is a cross-sectional schematic view that serves to describe a method of manufacture of a light-emitting diode that is an embodiment of the present invention.

Next, as shown in FIG. 9, the reflecting layer 6 is formed on the ohmic contact electrodes 7 and the transparent film 8.

Specifically, the reflecting layer 6 composed of APC or Au is formed on the ohmic contact electrodes 7 and the transparent film 8 using, for example, the vapor deposition method. At this time, as there are no gaps between the ohmic contact electrodes 7 and the transparent film 8, and as they are in a state of mutually close contact, the reflecting layer 6 can be formed without entering between the ohmic contact electrodes 7 in the transparent film 8.

<Barrier Layer Formation Step>

Next, as shown in FIG. 9, the barrier layer 5 is formed on the reflecting layer 6.

Specifically, the barrier layer 5 composed of nickel is formed on the reflecting layer 6 using, for example, the vapor deposition method.

<Bonding Layer Formation Step>

Next, as shown in FIG. 9, the bonding layer 4 is formed on the barrier layer 5.

Specifically, the bonding layer 4 composed of AuGe that is an Au eutectic metal is formed on the barrier layer 5 using, for example, the vapor deposition method.

<Substrate Bonding Step>

Figure 10:
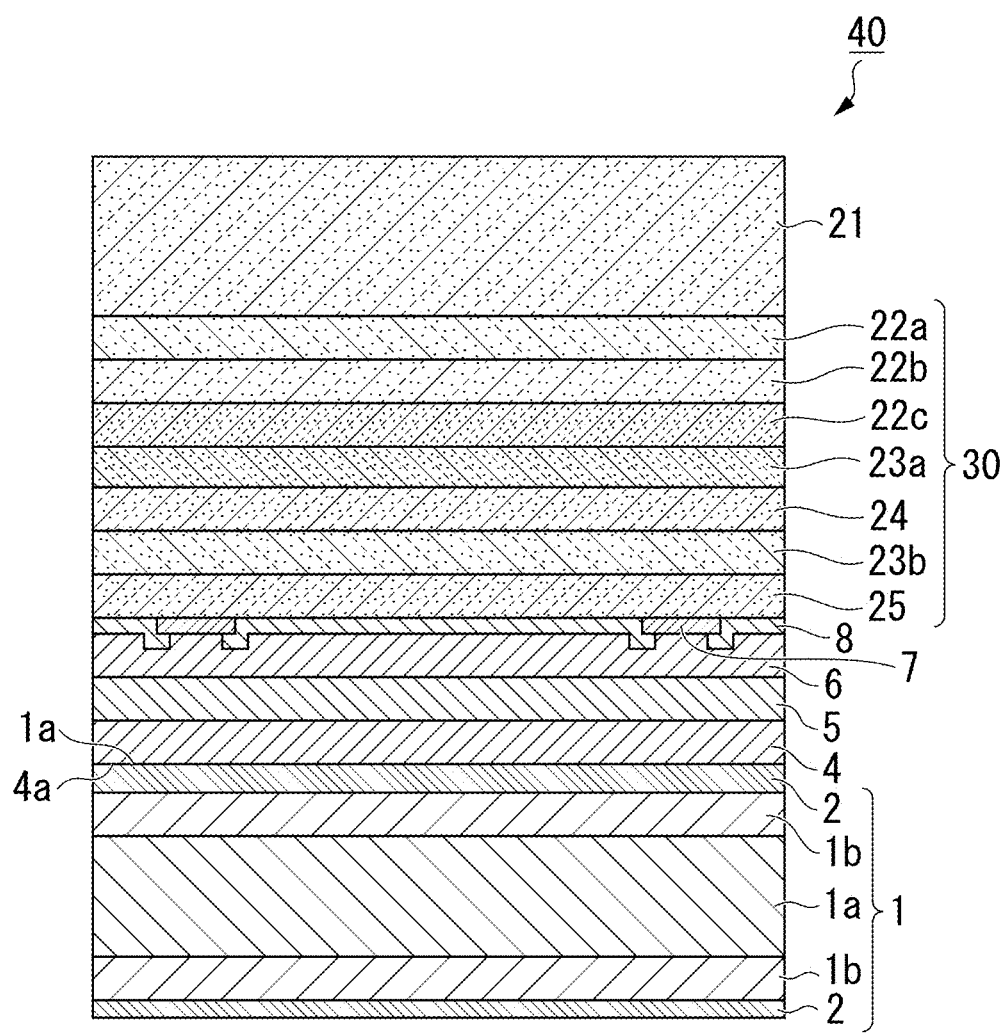
FIG. 10 is a cross-sectional schematic view that serves to describe a method of manufacture of a light-emitting diode that is an embodiment of the present invention.

Next, as shown in FIG. 10, the semiconductor substrate 21 on which the epitaxial laminate 30, the reflecting layer 6, and so on are formed, and the metal substrate 1 that was formed in the substrate manufacturing step are brought into a pressure-reducing device, and are arranged so as to be superimposed with the bonding face 4a of the bonding layer 4 and the bonding face 1a of the metal substrate 1 such that they face each other.

Next, after the interior of the pressure-reducing device has been evacuated to $3 \times 10^{-5}$ Pa, a load of 500 kg is applied in a state where the superimposed metal substrate 1 and semiconductor substrate 21 have been heated to 400° C., bonding the bonding surface 4a of the bonding layer 4 and the bonding surface 1a of the metal substrate 1, and forming a bonding laminate 40.

<Semiconductor Substrate and Buffer Layer Removal Step>

Figure 11:
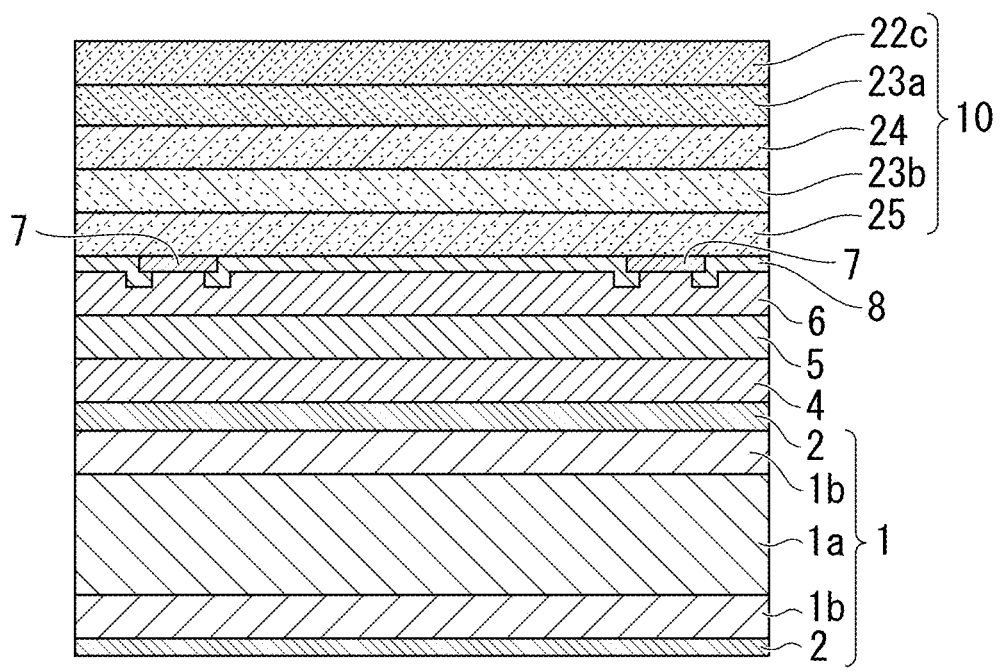
FIG. 11 is a cross-sectional schematic view that serves to describe a method of manufacture of a light-emitting diode that is an embodiment of the present invention.

Next, as shown in FIG. 11, the growth substrate (semiconductor substrate) 21 and the buffer layer 22a are selectively removed by an ammonia etchant from the bonding laminate 40.

At this time, degradation in the quality of the metal substrate is prevented, because the metal substrate of the present invention is covered by the metal protection film, and is highly resistant to etchant.

<Etching Stop Layer Removal Step>

Next, the etching stopper layer 22b is selectively removed by a hydrochloric etchant. By this means, the compound semiconductor layer 10 including the light-emitting layer 24 is formed.

As the metal substrate of the present invention is covered by the metal protection film, and is highly resistant to etchant, degradation in the quality of the metal substrate is prevented.

<Ohmic Electrode Formation Step>

Figure 12:
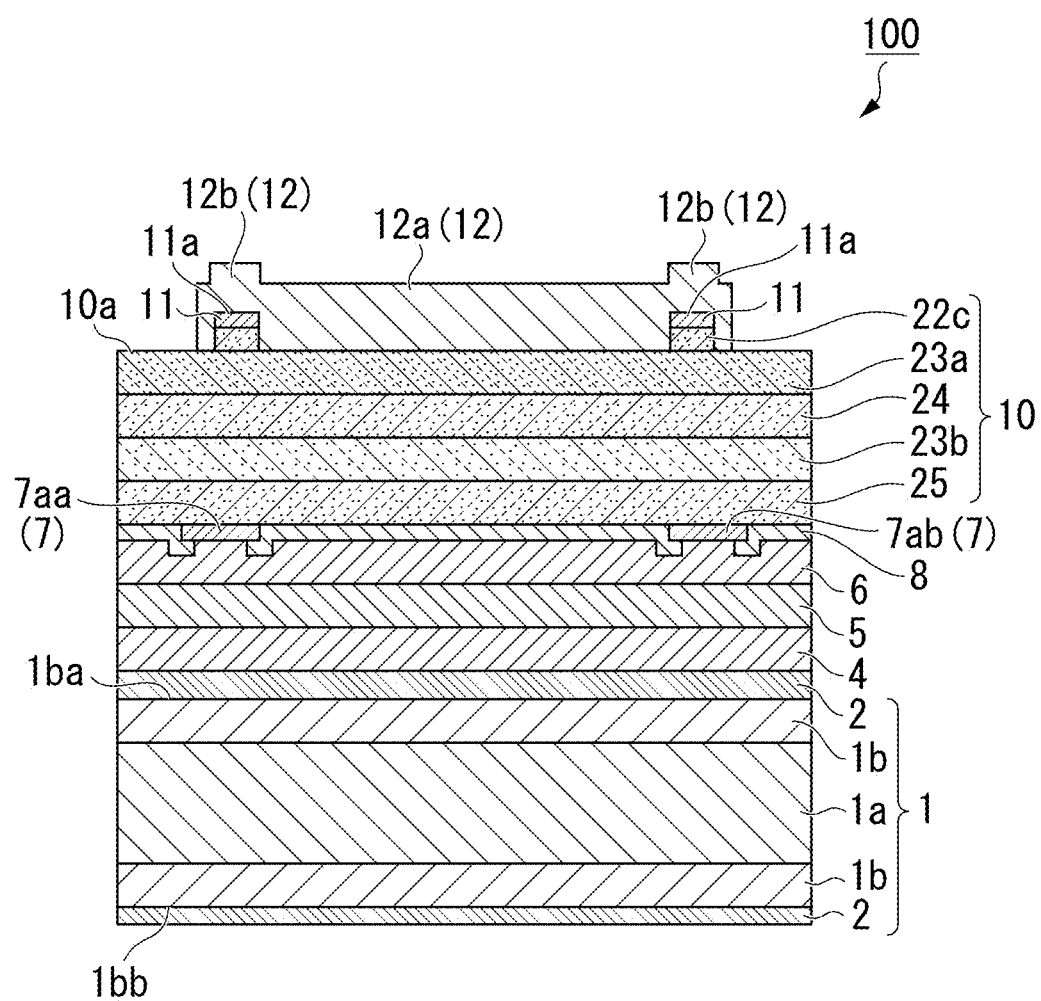
FIG. 12 is a cross-sectional schematic view that serves to describe a method of manufacture of a light-emitting diode that is an embodiment of the present invention.

Next, as shown in FIG. 12, the ohmic electrodes 11 are formed on the side of the compound semiconductor layer 10 that is opposite the side where the ohmic contact electrodes 7 is provided.

Specifically, AuGeNi alloy of 0.1 μm thickness is formed over the entire surface using, for example, vapor deposition, and film composed of the AuGeNi alloy is subsequently patterned using photolithography and etching techniques to form ohmic electrodes 11 respectively consisting of the 6 linear parts 11ba, 11bb, 11ca, 11cb, 11cc, and 11cd shown in FIG. 3B.

Using the mask employed in the aforementioned patterning of the ohmic electrode formation step, the contact layer 12c other than the portions underneath the ohmic electrodes 11 is removed by etching, for example, by means of a liquid mixture of ammonia water ($NH_4OH$)/hydrogen peroxide ($H_2O_2$)/pure water ($H_2O$). By this means, the planar forms of the ohmic electrodes 11 and the contact layer 12c are substantially the same, as shown in FIG. 12.

The respective linear parts of the ohmic electrodes 11 are positioned so as not overlap in planar view with the pad 12a of the surface electrode 12 formed in the below-described step, and are formed at positions that are covered by the linear parts 12b of the surface electrode 12.

<Surface Electrode Formation Step>

Next, the surface electrodes 12 respectively consisting of the pad 12a and the linear parts 12b connecting to the pad are formed on the surface of the compound semiconductor layer 10 that is on the opposite side of the ohmic contact electrodes 7 so as to cover the ohmic electrodes 11.

Specifically, an Au layer of 0.3 μm thickness, a Ti layer of 0.3 μm thickness, and an Au layer of 1 μm thickness are sequentially formed over the entire surface using, for example, vapor deposition, and the Au/Ti/Au film is subsequently patterned using photolithography and etching techniques to form a surface electrode 12 consisting of the pad 12a, and the linear parts 12b composed of the 2 first linear parts 12baa, 12bab and 6 second linear parts 12bba, 12bbb, 12bca, 12bcb, 12bcc, and 12bcd that connect to the pad, as shown in FIG. 3A.

The respective second linear parts are formed at positions that respectively cover the 6 linear parts configuring the ohmic electrode 11.

<Dividing Step>

Next, the light-emitting diodes on the wafer are divided.

After removing the semiconductor layer in the regions to be cut, the structure including the substrate 1 formed in the foregoing steps is cut by laser at, for example, 350 μm intervals to fabricate the light-emitting diodes 100.

<Substrate Side Surface Metal Protection Film Formation Step>

Regarding the respective light-emitting diodes 100 that have been divided, metal protection film is not formed on the side surfaces of the substrate 1, but metal protection film may be formed on the side surfaces of the substrate 1 that have been cut, under the same conditions as the formation conditions of the metal protection film provided on the top surface and bottom surface.

EXAMPLES

The present invention is explained in detail below based on Examples. However, the present invention is not limited to these Examples alone.

Example 1

Example 1 is an example of the embodiment shown in FIG. 1 and FIG. 2.

With respect to the light-emitting diode of Example 1, first, an Mo layer (foil or sheet) of 75 μm thickness was interposed between two Cu layers (foils or sheets) of 10 μm thickness, and thermal compression was conducted to form a metal plate (before cutting for division) of 95 μm thickness. The top surface and bottom surface of this metal plate were polished, and the top surface was made into a lustrous surface, after which cleaning was conducted with organic solvent to remove impurities. Next, a 2 μm Ni layer and a 1 μm Au layer were sequentially formed as metal protection film over the entire surface of this metal plate by non-electrolytic plating to fabricate the metal substrate (metal substrate before cutting for division) 1.

Next, the compound semiconductor layer was sequentially laminated onto a GaAs substrate 21 composed of Si-doped n-type GaAs single crystal to fabricate an epitaxial wafer with a light-emission wavelength of 620 nm.

With respect to the GaAs substrate 21, the surface inclined at 15° in the (0-1-1) direction from the (100) surface was the growth surface, and carrier concentration was set at $1 \times 10^{18}$ $cm^{-3}$. The compound semiconductor layers were the n-type buffer layer 22a composed of Si-doped GaAs, the etching stop layer 22b composed of Si-doped $(Al_{0.5}Ga_{0.5})_{0.5}In_{0.5}P$, the n-type contact layer 22c composed of Si-doped GaAs, the n-type surface roughened layer 23aa composed of Si-doped $(Al_{0.5}Ga_{0.5})_{0.5}In_{0.5}P$, the n-type upper clad layer 23ab composed of Si-doped $Al_{0.5}In_{0.5}P$, the light-emitting layer 24 of well layers/barrier layers consisting of 20 pairs of $(Al_{0.1}Ga_{0.9})_{0.5}In_{0.5}P/(Al_{0.5}Ga_{0.5})_{0.5}In_{0.5}P$, the p-type lower clad layer 23b composed of $Al_{0.5}In_{0.5}P$, and the current diffusion layer 25 composed of Mg-doped p-type GaP.

In the present example, the epitaxial wafer was formed by epitaxially growing the compound semiconductor layer on a GaAs substrate of 50 mm diameter and 350 µm thickness using a pressure-reducing metal organic chemical vapor deposition apparatus method (MOCVD apparatus). When the epitaxial growth layer was grown, trimethyl aluminum (($CH_3)_3Al$), trimethyl gallium (($CH_3)_3Ga$), and trimethyl indium (($CH_3)_3In$) were used as the raw material of group-III constituent elements. As the Mg doping raw material, bis-cyclopentadienyl magnesium (bis-$(C_5H_5)_2Mg$) was used. As the Si-doping raw material, disilane ($Si_2H_6$) is used. As the raw material of group-V constituent elements, phosphine ($PH_3$) and arsine ($AsH_3$) were used. With respect to the growth temperature of the various layers, the current diffusion layer composed of p-type GaP is grown at 750° C. Each of the other layers is grown at 700° C.

With respect to the buffer layer composed of GaAs, carrier concentration was set at approximately $1\times10^{18}$ $cm^{-3}$, and layer thickness was set at approximately 0.5 µm. With respect to the etching stop layer, carrier concentration was set at approximately $1\times10^{18}$ $cm^{-3}$, and layer thickness was set at approximately 0.5 µm. With respect to the contact layer, carrier concentration was set at approximately $1\times10^{18}$ $cm^{-3}$, and layer thickness was set at approximately 0.05 µm. With respect to the surface roughened layer, carrier concentration was set at approximately $1\times10^{18}$ $cm^{-3}$, and layer thickness was set at approximately 3 µm. With respect to the upper clad layer, carrier concentration was set at approximately $2\times10^{18}$ $cm^{-3}$, and layer thickness was set at approximately 0.5 µm. With respect to the well layer, undoped layer thickness was $(Al_{0.1}Ga_{0.9})_{0.5}In_{0.5}P$ of approximately 5 nm, and with respect to the barrier layer, undoped layer thickness was $(Al_{0.5}Ga_{0.5})_{0.5}In_{0.5}P$ of approximately 5 nm. The well layer and barrier layer were alternately deposited in 20 pairs. With respect to the lower clad layer, carrier concentration was approximately $8\times10^{17}$ $cm^{-3}$, and layer thickness was approximately 0.5 µm. With respect to the current diffusion layer composed of GaP, carrier concentration was approximately $5\times10^{18}$ $cm^{-3}$, and layer thickness was approximately 3 µm.

Next, the current diffusion layer 25 was polished from the surface to a region reaching a depth of approximately 2 µm, and subjected to specular finishing. As a result of this specular finishing, the roughness of the surface of the current diffusion layer was set at 0.18 nm.

Next, a mask having apertures corresponding to the formation positions of the ohmic contact electrodes 7 on the current diffusion layer 25 was formed on the current diffusion layer 25, and ohmic contact electrodes 7 composed of AuBe alloy with the pattern shown in FIG. 3C were formed using vapor deposition. The cylindrical conductive members configuring the ohmic contact electrodes 7 have a diameter of 9 µm, and the interval between linearly adjacent conductive members was 10 µm.

Next, the $SiO_2$ film 8a was formed over the entire surface of the current diffusion layer 25 using CVD so as to cover the ohmic contact electrodes 7. At this time, the thickness of the $SiO_2$ film 8a was 0.3 µm.

Next, a photoresist pattern was formed on the $SiO_2$ film 8a so as to expose the surfaces of the ohmic contact electrodes 7 except for the periphery 7a, and the $SiO_2$ film 8a on the ohmic contact electrodes 7 except for the periphery 7a was removed using a fluoric etchant. By this means, the transparent film 8 composed of $SiO_2$ was formed so as to cover the current diffusion layer 25 and the periphery 7a of the ohmic contact electrodes 7.

Next, the reflecting layer 6 composed of Au film of 0.7 µm thickness was formed on the ohmic contact electrodes 7 and the transparent film 8 using vapor deposition.

Next, the barrier layer 5 composed of Ti film of 0.5 µm thickness was formed on the reflecting layer 6 using vapor deposition.

Next, the bonding layer 4 composed of AuGe film of 1.0 µm thickness was formed on the barrier layer 5 using vapor deposition.

Next, the metal substrate 1 and the structure in which the compound semiconductor layer and the reflecting layer 6 and the like were formed on the GaAs substrate 21 (see FIG. 9) were arranged so as to be superimposed and faced to each other, were brought into a pressure-reducing apparatus, and were bonded with loads of 500 kg weight in a state where they were heated to 400° C. to form the bonded structure.

Next, the GaAs substrate 21 which is the growth substrate of the compound semiconductor layer and the buffer layer 22a were selectively removed from the bonded structure by an ammonia etchant, and the etching stop layer 22b was also selectively removed by a hydrochloric etchant.

Next, the ohmic electrodes 11 composed of AuGeNi alloy of 0.1 µm thickness with the pattern shown in FIG. 3B were formed on the surface of the compound semiconductor layer 10, wherein the surface was on the opposite side of the ohmic contact electrodes 7, using vapor deposition.

The width of the six linear parts was in each case 4 µm, the length of the linear parts 11ba and 11bb was 270 µm, and the length of the linear parts 11ca, 11cb, 11cc, and 11cd was 85 µm.

Next, the surface electrodes 12 respectively composed of the pad 12a of 1.6 µm thickness and the linear parts 12b shown in FIG. 3A were formed on the surface of the compound semiconductor layer 10 that is on the opposite side of the ohmic contact electrodes 7 so as to cover the ohmic electrodes 11 using vapor deposition.

The pad 12a has a diameter of 100 µm, and the width of the linear parts 12b was 8 µm for both the first linear parts and the second linear parts.

The length of the first linear parts 12baa and 12bab was 43 µm, the length of the second linear parts 12bba and 12bbb was 270 µm, and the length of the second linear parts 12bca, 12bcb, 12bcc, and 12bcd was 100 µm.

Next, the planned cutting portions for purposes of separation into chips were removed from the compound semiconductor layer 10 to the bonded layer 4, and the metal substrate 1 was cut into a square shape at a pitch of 350 µm by laser dicing.

Next, the light-emitting diode chips of Example 1 fabricated in the foregoing manner were mounted onto mounting substrates, and assembled into an LED lamp.

Next, the properties of these light-emitting diodes (LED lamp) were evaluated.

Figure 13:
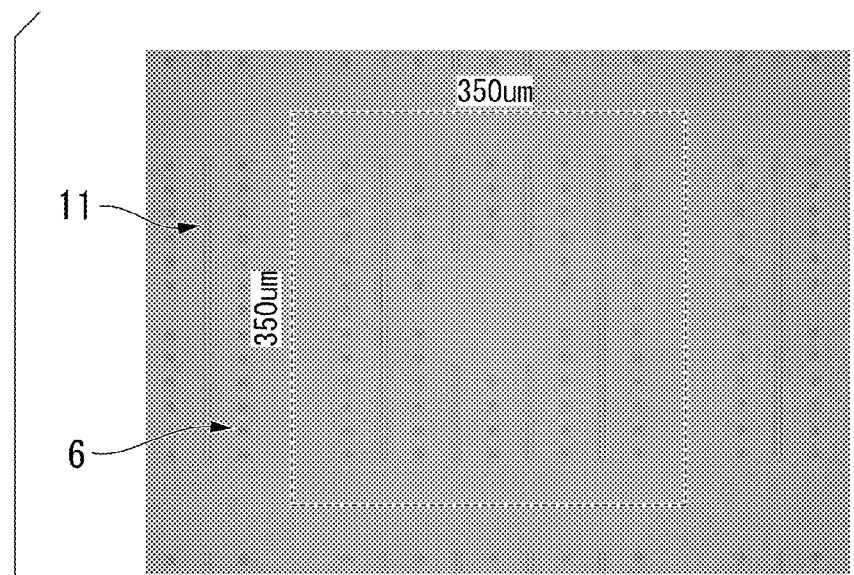
FIG. 13 shows optical microscope images of the light-emitting diode of Example, where (a) is a planar image, and (b) is an enlarged planar image of a vicinity of an ohmic contact electrode.
Figure 13:
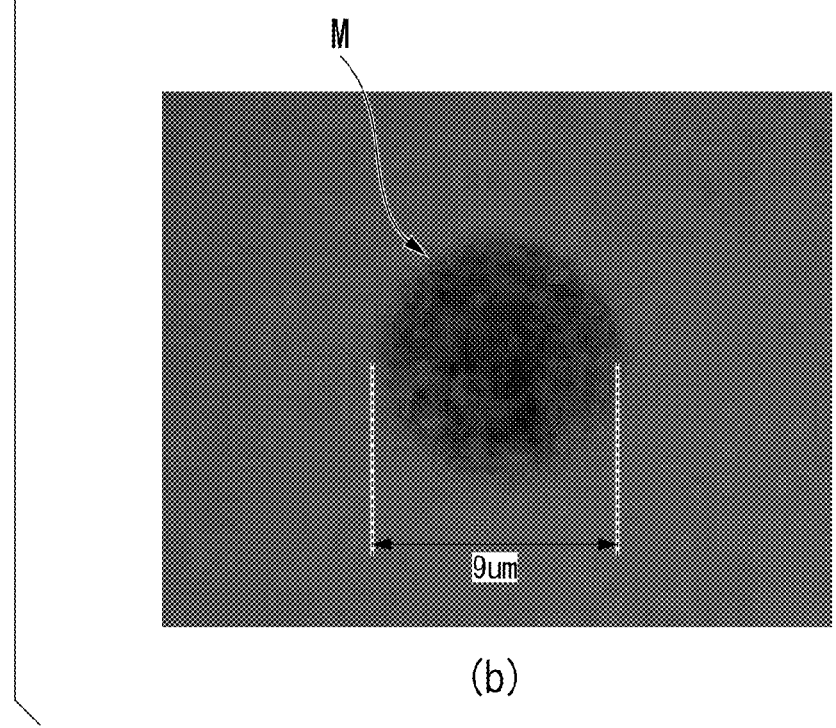
Figure 14:
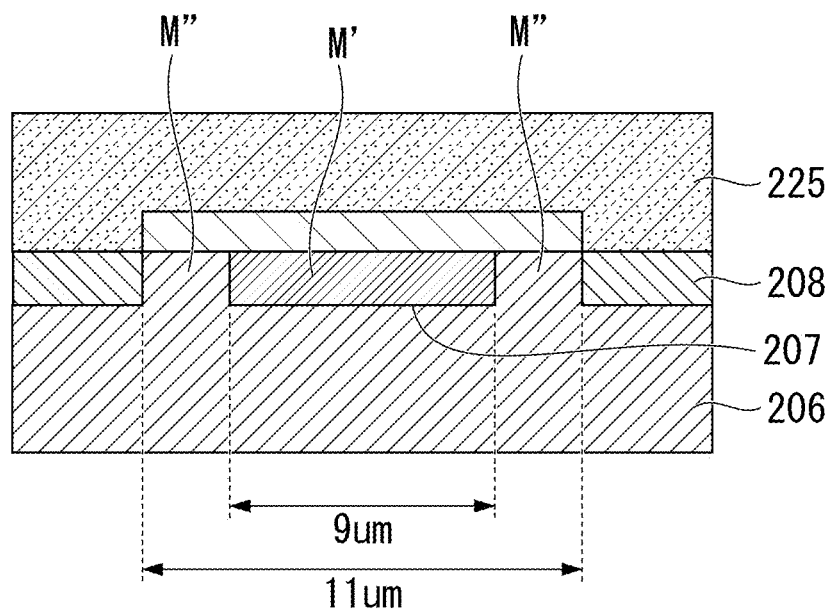
FIG. 14 is an enlarged cross-sectional schematic view of an ohmic contact electrode and its vicinity of a conventional light-emitting diode.
Figure 15:
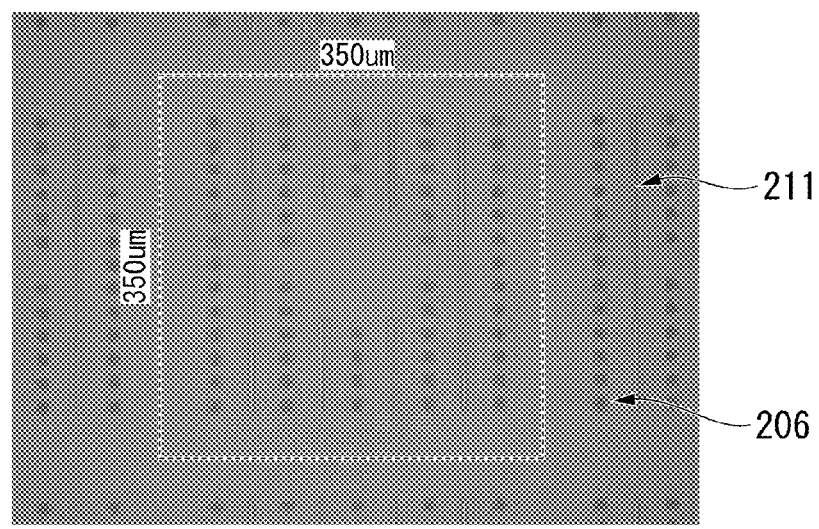
FIG. 15 shows optical microscope images of a light-emitting diode which is a conventional light-emitting diode, where (a) is a planar image, and (b) is an enlarged planar image of a vicinity of an ohmic contact electrode.
Figure 15:
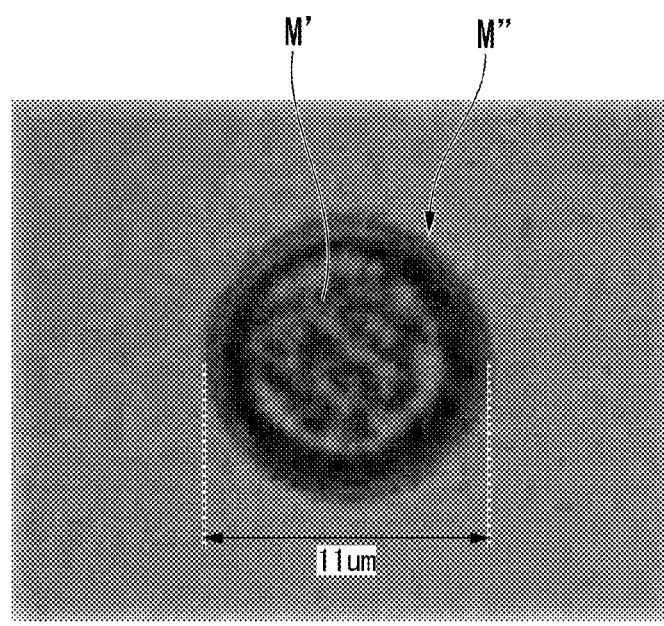

FIG. 13(a) is an optical microscope image of a light-emitting diode of the present Example. FIG. 13(b) is an enlarged image of the ohmic contact electrode 7 and the transparent film 25 in the light-emitting diode shown in FIG. 13(a). As in FIG. 15(a), FIG. 13(a) is an optical microscope image taken after formation of the ohmic electrodes 11, but at a stage prior to surface electrode formation.

In the optical microscope image of a conventional light-emitting diode (see FIG. 15), it is clear that the current diffusion layer and the reflecting layer come into contact in the gaps between the ohmic contact electrodes and the transparent film, forming an alloy layer. On the other hand, in the optical microscope image of a light-emitting diode of the present embodiment (see FIG. 13), it is clear that an alloy layer of the current diffusion layer and the reflecting layer is not formed. Accordingly, the light-emitting diode of the present Example has an improved reflectance compared to the conventional light-emitting diode.

Specifically, when current flows between the n-type and p-type ohmic electrodes, the red light that constitutes the dominant wavelength of 620 nm was emitted. Forward voltage ($V_F$) when current of 20 milliamperes (mA) flowed in the forward direction was 1.91 V. Light-emitting output was 8.2 mW when forward current was 20 mA, and an improvement of approximately 5% f was achieved as compared with the conventional case.

Electrical current tests (30 mA current) were performed for 1000 hours on 20 of these lamps under a high-temperature high-humidity environment at a temperature of 60° C. and humidity of 90%. The average survival rate of light-emitting output was 98%, and $V_F$ was almost without fluctuation at 99%.

INDUSTRIAL APPLICABILITY

The present invention can be applied to light-emitting diodes and their method of manufacture.

DESCRIPTION OF THE REFERENCE NUMERALS 1 substrate
1a, 1b metal layer
1ba top surface
1bb bottom surface
2 metal protection film
4 bonding layer
5 barrier layer
6 reflecting layer
7 ohmic contact electrode
7a periphery
7b first main surface
7c second main surface
7d side surface
7aa, 7ab, 7ba, 7bb, 7bc, 7bd, 7ca, 7cb group of dot-shaped conductive members
8 transparent film
10 compound semiconductor layer
11 ohmic electrode
11ba, 11bb, 11ca, 11cb, 11cc, 11cd linear parts
1 surface electrode
12a pad
12b linear parts
12baa, 12bab first linear parts
12bba, 12bbb, 12bca, 12bcb, 12bcc, 12bcd second linear parts
21 semiconductor substrate (growth substrate)
100 light-emitting diode
M alloy layer

The invention claimed is:

1. A method of manufacture of a light-emitting diode comprising a substrate upon which are sequentially provided a reflecting layer, a transparent film wherein multiple ohmic contact electrodes are embedded at intervals, and a compound semiconductor layer sequentially including a current diffusion layer and a light-emitting layer, which comprises the following steps in this order:
   a step of forming a compound semiconductor layer that includes a light-emitting layer and a current diffusion layer on a growth substrate in this order;
   a step of forming multiple ohmic contact electrodes that are disposed at intervals on said current diffusion layer, wherein said ohmic contact electrodes are cylindrical members having a diameter of about 5 to 20 μm;
   a step of forming a transparent film having a film thickness of 0.05 to 1.00 μm on said current diffusion layer so as to cover a periphery of the surface facing the substrate of each of said multiple ohmic contact electrodes and so as to expose a part of the surface except for the covered periphery;
   a step of forming a reflecting layer on said transparent film, and on the exposed portions of said ohmic contact electrodes;
   a step of forming a bonding layer on said reflecting layer;
   a step of bonding a substrate to said bonding layer;
   and a step of removing said growth substrate,
   wherein current diffusion layer is composed of any one of GaP, $\{Al_xGa_{(1-x)}\}_{(1-y)}In_yP$, or $\{Al_xGa_{(1-x)}\}_{(1-y)}In_yAs$.

2. The method of manufacture of a light-emitting diode according to claim 1, wherein, in the step which forms said transparent film, said transparent film is formed so as to cover said multiple ohmic contact electrodes and said current diffusion layer, and then a part of the transparent film is removed from the surface of each of said ohmic contact electrodes apart from said periphery.

3. The method of manufacture of a light-emitting diode according to claim 1, wherein, in the step which forms said transparent film, a mask is formed on the surface of each of said ohmic contact electrodes apart from said periphery, and said transparent film is formed so as to cover said multiple ohmic contact electrodes and said current diffusion layer, after which said mask is removed.

4. The method of manufacture of a light-emitting diode according to claim 1, wherein the ohmic contact electrodes comprise Au.

5. The method of manufacturing of a light-emitting diode according to claim 1, wherein the compound semiconductor layer comprises a pn junction formed internally therein.

6. The method of manufacture of a light-emitting diode according to claim 1, wherein said ohmic contact electrodes each has a peripheral edge and said periphery is covered by said transparent film in a range that is within 1.5 μm from the peripheral edges of said ohmic contact electrodes.

7. A light-emitting diode comprising a substrate upon which is sequentially provided a reflecting layer, a transparent film having a film thickness of 0.05 to 1.00 μm wherein multiple ohmic contact electrodes having peripheral edges are embedded at intervals, and a compound semiconductor layer sequentially including a current diffusion layer and a light-emitting layer, wherein:
   a periphery of a surface of each of said ohmic contact electrodes, wherein the surface is provided on and faces said substrate side, is covered by said transparent film and a part of the surface except for the periphery is exposed,
   said ohmic contact electrodes contact said reflecting layer and said current diffusion layer,
   said ohmic contact electrodes are cylindrical members having a diameter of about 5 to 20 μm, and
   said current diffusion layer is composed of any one of GaP, $\{Al_xGa_{(1-x)}\}_{(1-y)}In_yP$, or $\{Al_xGa_{(1-x)}\}_{(1-y)}In_yAs$.

8. The light-emitting diode according to claim 7, wherein said periphery are in a range that is within 1.5 μm from the peripheral edges of said ohmic contact electrodes.

9. The light-emitting diode according to claim 7, wherein said reflecting layer is composed of any one of Au, Ag, Cu, or Al, or an alloy including one or more of these elements.

10. The light-emitting diode according to claim 7, wherein said transparent film is composed of any one of $SiO_2$, SiN, SiON, $Al_2O_3$, $MgF_2$, $TiO_2$, TiN, ZnO, ITO, or IZO.

11. The light-emitting diode according to claim 7, wherein the ohmic contact electrodes comprise Au.

12. The light-emitting diode according to claim 7, wherein the compound semiconductor layer comprises a pn junction formed internally therein.

13. The light-emitting diode according to claim 7, wherein said ohmic contact electrodes each has a peripheral edge and said periphery is covered by said transparent film in a range that is within 1.5 μm from the peripheral edges of said ohmic contact electrodes.

* * * * *